(12) United States Patent
Tanaka et al.

(10) Patent No.: US 11,594,382 B2
(45) Date of Patent: Feb. 28, 2023

(54) SOLAR CELL MODULE

(71) Applicant: RICOH COMPANY, LTD., Tokyo (JP)

(72) Inventors: Yuuji Tanaka, Shizuoka (JP); Tamotsu Horiuchi, Shizuoka (JP); Nozomu Tamoto, Shizuoka (JP); Takahiro Ide, Shizuoka (JP); Naomichi Kanei, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/981,985

(22) PCT Filed: Feb. 19, 2019

(86) PCT No.: PCT/JP2019/006039
§ 371 (c)(1),
(2) Date: Sep. 17, 2020

(87) PCT Pub. No.: WO2019/181330
PCT Pub. Date: Sep. 26, 2019

(65) Prior Publication Data
US 2021/0104367 A1    Apr. 8, 2021

(30) Foreign Application Priority Data
Mar. 19, 2018 (JP) .............................. JP2018-051153

(51) Int. Cl.
*H01G 9/20* (2006.01)
*H01L 51/42* (2006.01)
*H01L 51/44* (2006.01)

(52) U.S. Cl.
CPC ......... *H01G 9/2077* (2013.01); *H01G 9/2018* (2013.01); *H01G 9/2059* (2013.01);
(Continued)

(58) Field of Classification Search
CPC .. H01G 9/2077; H01G 9/2018; H01G 9/2059; H01G 9/2081; H01G 9/2068;
(Continued)

(56) References Cited

U.S. PATENT DOCUMENTS 9,318,270 B2   4/2016   Horiuchi et al.
9,373,450 B2   6/2016   Arai et al.
(Continued)

FOREIGN PATENT DOCUMENTS

CN    101615514 A    12/2009
JP    2005-243379    9/2005
(Continued)

OTHER PUBLICATIONS

JP-2006324090-A English machine translation (Year: 2006).*
(Continued)

*Primary Examiner* — Andrew J Golden
(74) *Attorney, Agent, or Firm* — Xsensus LLP

(57) ABSTRACT

Provided is a solar cell module including photoelectric conversion elements, wherein each of the photoelectric conversion elements includes a first substrate, and a first electrode, a hole blocking layer, an electron transport layer, a hole transport layer, a second electrode, and a second substrate on the first substrate, and a sealing member between the first substrate and the second substrate, and wherein, within at least two of the photoelectric conversion elements adjacent to each other, the hole-blocking layers are not extended to each other but the hole transport layers are in a state of a continuous layer where the hole transport layers are extended to each other.

8 Claims, 3 Drawing Sheets

(52) U.S. Cl.
CPC ........ *H01L 51/4273* (2013.01); *H01L 51/442* (2013.01); *H01L 51/448* (2013.01)

(58) Field of Classification Search
CPC .......... H01G 9/20–2095; H01L 27/301; H01L 51/42–448; H01L 31/048; H01L 31/0481
USPC ....................................................... 136/251
See application file for complete search history.

(56) References Cited

U.S. PATENT DOCUMENTS

| | | | |
|---|---|---|---|
| 9,378,899 B2 | 6/2016 | Arai et al. | |
| 9,640,330 B2 | 5/2017 | Tanaka et al. | |
| 2010/0078075 A1 | 4/2010 | Tsukahara | H01L 51/448 136/263 |
| 2011/0174352 A1 | 7/2011 | Yang et al. | |
| 2011/0232736 A1* | 9/2011 | Goldstein | H01G 9/2077 136/256 |
| 2012/0125414 A1 | 5/2012 | Kamezaki et al. | |
| 2012/0126356 A1* | 5/2012 | Iwabuchi | H01L 51/448 257/E51.012 |
| 2013/0333739 A1* | 12/2013 | Huang | H01L 51/426 136/244 |
| 2014/0116493 A1* | 5/2014 | Lee | H01L 27/301 136/244 |
| 2014/0212705 A1 | 7/2014 | Horiuchi et al. | |
| 2015/0053258 A1 | 2/2015 | Beck et al. | |
| 2015/0279573 A1* | 10/2015 | Horiuchi | H01L 51/4226 136/263 |
| 2015/0380465 A1* | 12/2015 | Huang | H01L 27/301 136/249 |
| 2016/0118522 A1* | 4/2016 | Lee | H01G 9/2081 136/244 |
| 2016/0268532 A1 | 9/2016 | Nakao et al. | |
| 2016/0276609 A1 | 9/2016 | Horiuchi et al. | |
| 2017/0069431 A1 | 3/2017 | Tanaka et al. | |
| 2017/0092433 A1 | 3/2017 | Kanei et al. | |
| 2017/0222150 A1 | 8/2017 | Arai et al. | |
| 2017/0243698 A1 | 8/2017 | Kanei et al. | |
| 2017/0358399 A1 | 12/2017 | Matsuyama et al. | |
| 2018/0053863 A1 | 2/2018 | Tanaka et al. | |
| 2018/0197688 A1 | 7/2018 | Horiuchi et al. | |
| 2018/0198083 A1 | 7/2018 | Tanaka et al. | |
| 2018/0330890 A1 | 11/2018 | Tanaka et al. | |
| 2019/0115487 A1* | 4/2019 | Huang | H01L 51/448 |

FOREIGN PATENT DOCUMENTS

| | | |
|---|---|---|
| JP | 2006324090 A * | 11/2006 |
| JP | 2008-204881 | 9/2008 |
| JP | 2009-043482 | 2/2009 |
| JP | 2010-165671 | 7/2010 |
| JP | 2013-131477 | 7/2013 |
| JP | 2014-143333 | 8/2014 |
| JP | 2016-178288 | 10/2016 |
| JP | 2017-011066 | 1/2017 |
| KR | 10-2011-0085837 A | 7/2011 |
| WO | WO2012/101207 A2 | 8/2012 |

OTHER PUBLICATIONS

JP-2010165671-A English machine translation (Year: 2010).*
JP-2008204881-A English machine translation (Year: 2008).*
Jiajiu Ye, Li Zhou, Liangzheng Zhu, Xuhui Zhang, Zhipeng Shao, Xu Pan, and Songyan Dai, "Bipyridine type Co-complexes as hole-transporting material dopants in perovskite solar cells", RSC Advances, vol. 6, No. 21, Jan. 29, 2016 (Jan. 29, 2016), pp. 17354-17359, XP055586925, DOI:10.1039/C5RA25753K.
International Search Report dated Jun. 25, 2019 for counterpart International Patent Application No. PCT/JP2019/006039 filed Feb. 19, 2019.
Written Opinion dated Jun. 25, 2019 for counterpart International Patent Application No. PCT/JP2019/006039 filed Feb. 19, 2019.
PCT Collaborative Search and Examination Pilot Peer Contribution uploaded May 9, 2019 by the EPO which is a peer ISA for counterpart International Patent Application No. PCT/2019/006039 filed Feb. 19, 2019.
PCT Collaborative Search and Examination Pilot Peer Contribution dated May 13, 2019 by the USPTO which is a peer ISA for counterpart International Patent Application No. PCT/JP2019/006039 filed Feb. 19, 2019.
PCT Collaborative Search and Examination Pilot Peer Contribution dated May 17, 2019 by the CNIPA which is a peer ISA for counterpart International Patent Application No. PCT/JP2019/006039 filed Feb. 19, 2019.
PCT Collaborative Search and Examination Pilot Peer Contribution dated May 22, 2019 by the KIPO which is a peer ISA for counterpart International Patent Application No. PCT/JP2019/006039 filed Feb. 19, 2019.
Japanese Office Action dated Jan. 18, 2022, in corresponding Japanese Patent Application No. 2018-051153, 8 pages.

* cited by examiner

[Fig. 1]
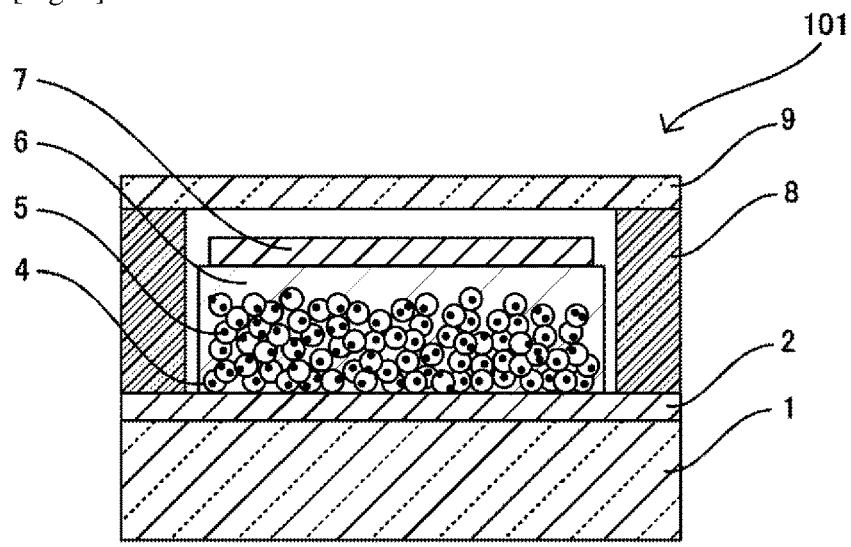
[Fig. 2]
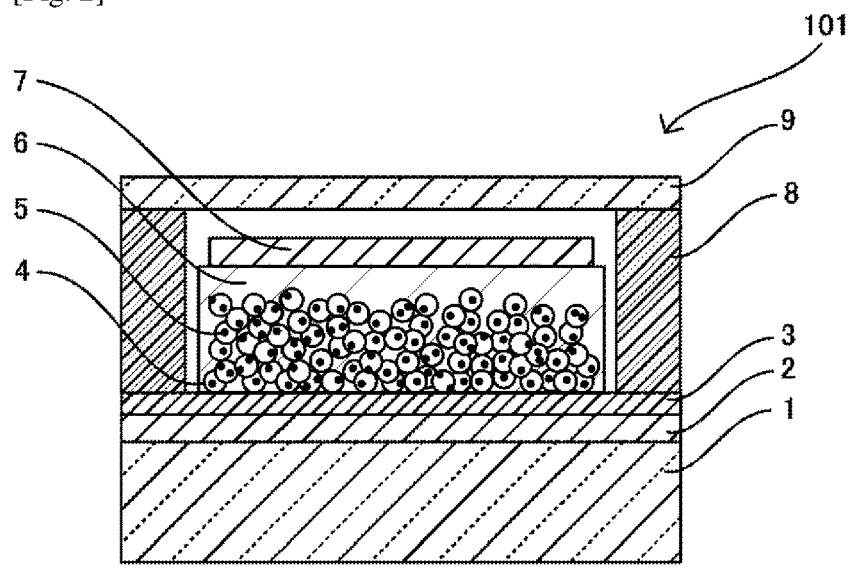
[Fig. 3]
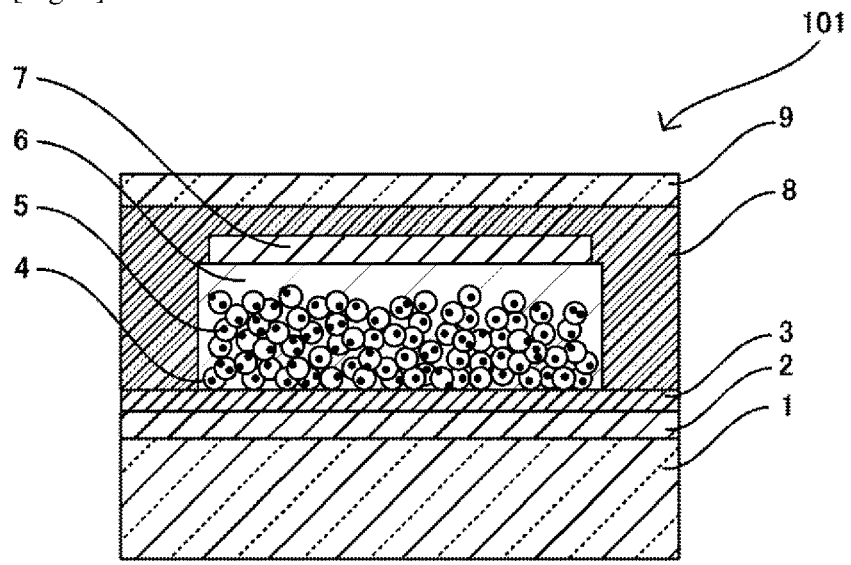

[Fig. 4]
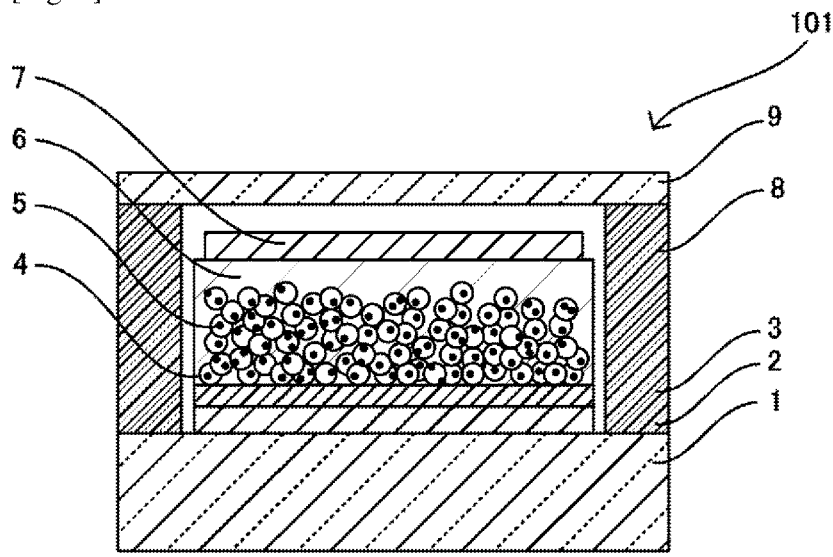
[Fig. 5]
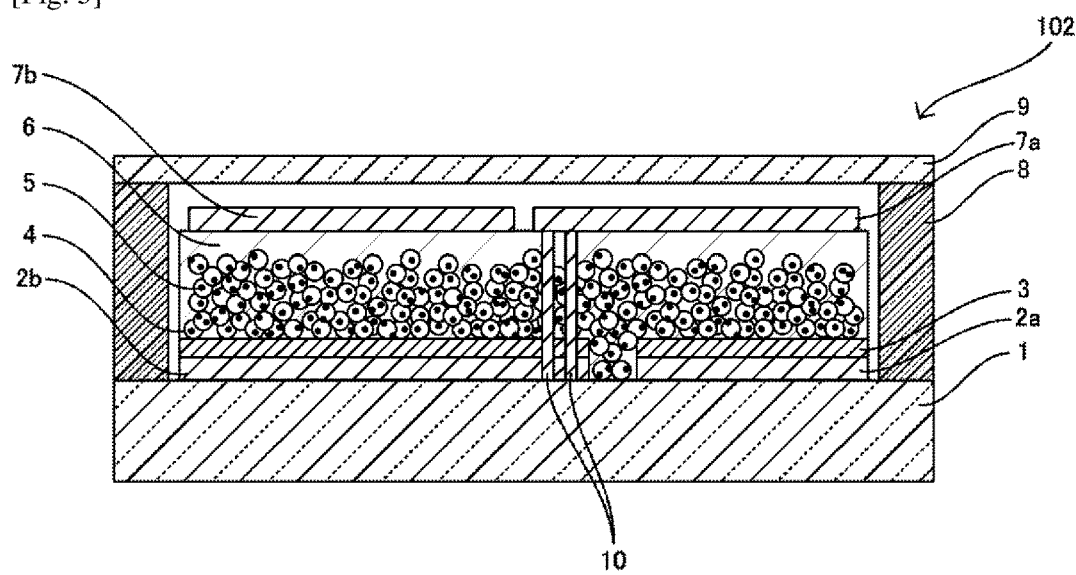
[Fig. 6]
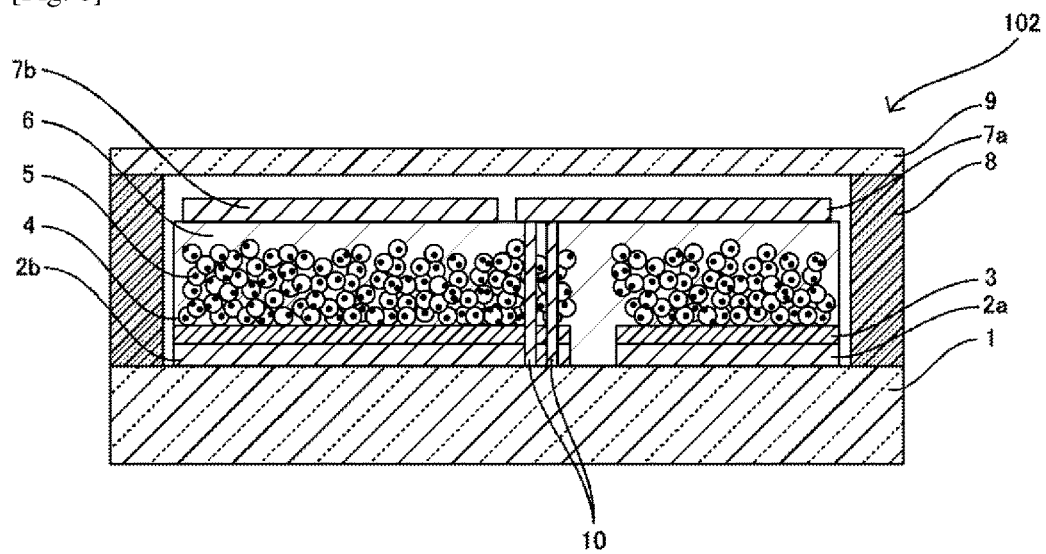

[Fig. 7]
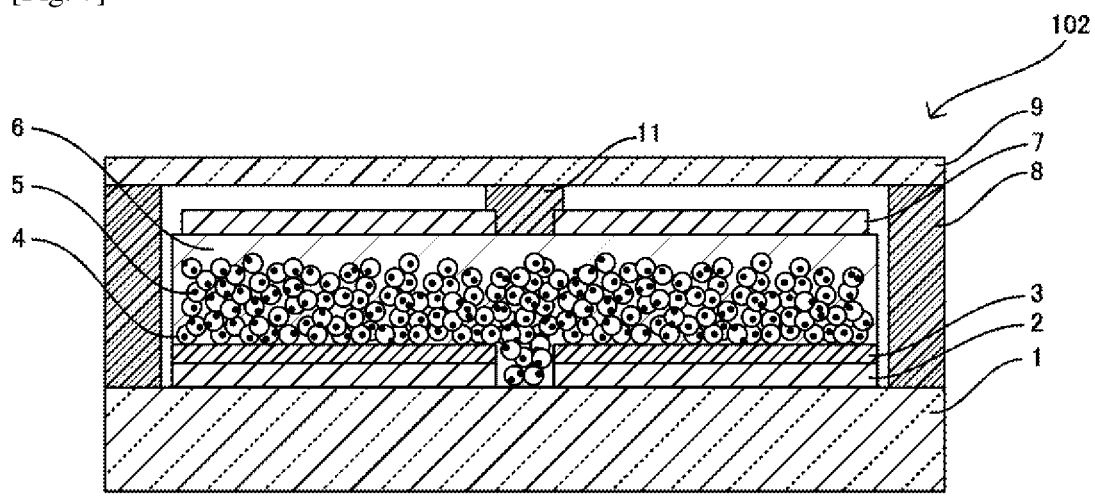

SOLAR CELL MODULE

TECHNICAL FIELD

The present disclosure relates to a solar cell module.

BACKGROUND ART

In recent years, solar cells have become more and more important as alternative energy for fossil fuels and as a measure against global warming. Moreover, solar cells that can efficiently generate power with light of low illuminance and are for indoor use have been recently attracted great attentions. Particularly, the latter solar cells are expected to be used in a wide range of applications as a self-sustaining power source that does not require battery replacement or power source wiring.

As photoelectric conversion elements for indoor use, amorphous silicon solar cells and dye-sensitized solar cells have been known. Among them, dye-sensitized solar cells are advantageous in terms of a reduction in cost because the dye-sensitized solar cells can be produced using printing methods known in the art. Generally, the dye-sensitized solar cells have a problem that an electrolyte liquid is evaporated or leaked because the electrolyte liquid is encapsulated therein. In recent years, however, solid dye-sensitized solar cells using p-type semiconductor materials have been developed and attracted attentions.

In order to improve durability of a solid dye-sensitized solar cell module, it is important to protect a photosensitizing compound adsorbed on a surface of titanium oxide from moisture and oxygen present in a sealed space, or outgas generated from a sealing resin. For example, PTL 1 therefore discloses a solar cell module durability of which is improved by disposing a material absorbing ultraviolet rays or a protective film inside a sealed space.

CITATION LIST

Patent Literature

PTL 1: Japanese Unexamined Patent Application Publication No. 2014-143333

SUMMARY OF INVENTION

Technical Problem

The present disclosure has an object to provide a solar cell module that can prevent a reduction in output with light of low illuminance before and after being exposed to light of high illuminance.

Solution to Problem

According to one aspect of the present disclosure, a solar cell module includes a plurality of photoelectric conversion elements. Each of the photoelectric conversion elements includes a first substrate, a first electrode, a hole blocking layer, an electron transport layer, a hole transport layer, a second electrode, a second substrate, and a sealing member. The first electrode, the hole blocking layer, the electron transport layer, the hole transport layer, the second electrode, and the second substrate are formed on the first substrate, and the sealing member is disposed between the first substrate and the second substrate. Within at least two of the photoelectric conversion elements adjacent to each other, the hole-blocking layers are not extended to each other but the hole transport layers are in a state of a continuous layer where the hole transport layers are extended to each other.

Advantageous Effects of Invention

The present disclosure can provide a solar cell module that can prevent a reduction in output with light of low illuminance before and after being exposed to light of high illuminance.

BRIEF DESCRIPTION OF DRAWINGS

FIG. 1 is a schematic view illustrating one example of a photoelectric conversion element of the present disclosure.

FIG. 2 is a schematic view illustrating another example of the photoelectric conversion element of the present disclosure.

FIG. 3 is a schematic view illustrating another example of the photoelectric conversion element of the present disclosure.

FIG. 4 is a schematic view illustrating another example of the photoelectric conversion element of the present disclosure.

FIG. 5 is a schematic view illustrating one example of a solar cell module of the present disclosure.

FIG. 6 is a schematic view illustrating one example of the solar cell module of the present disclosure.

FIG. 7 is a schematic view illustrating one example of the solar cell module of the present disclosure.

DESCRIPTION OF EMBODIMENTS

Solar Cell Module

A solar cell module of the present disclosure includes a plurality of photoelectric conversion elements. Each of the photoelectric conversion elements includes a first substrate, a first electrode, a hole blocking layer, an electron transport layer, a hole transport layer, a second electrode, a second substrate, and a sealing member. The first electrode, the hole blocking layer, the electron transport layer, the hole transport layer, the second electrode, and the second substrate are formed on the first substrate, and the sealing member is disposed between the first substrate and the second substrate. Within at least two of the photoelectric conversion elements adjacent to each other, the hole-blocking layers are not extended to each other but the hole transport layers are in a state of a continuous layer where the hole transport layers are extended to each other.

The solar cell module of the present disclosure has been accomplished based on the insight associated with a problem that output of a solar cell module known in the art reduces significantly with light of low illuminance, such as indoor light after the solar cell is exposed with light of high illuminance, such as sun light. Specifically, the insight is as described below. Since a solar cell module known in the art has hole blocking layers linked together to cause electric current leak with light of high illuminance, it is difficult to obtain high output with light of low illuminance if the solar cell module is exposed to light of high illuminance even once in the case where the solar cell module is used as a self-sustaining power source for a sensor etc. When a film of a hole blocking layer is formed after patterning a first electrode with laser light, moreover, gaps formed by the patterning cannot be sufficiently covered with the hole blocking layer. Therefore, a photosensitizing compound is easily damaged with light of high illuminance. As a result, it is difficult to obtain high output with light of low illuminance.

Within at least two adjacent photoelectric conversion elements in the solar cell module of the present disclosure, hole blocking layers are not linked together, but hole transport layers are linked together. As a result, the solar cell module of the present disclosure hardly causes electric current leakage with light of high illuminance and a photosensitizing compound is not easily damaged, and therefore a reduction in output with light of low illuminance before and after being exposed to light of high illuminance can be suppressed. Accordingly, the solar cell module of the present disclosure can have high power output with light emitted from an illumination device for indoor use, such as a light emitting diode (LED) and a fluorescent lamp, as well as sun light, even after being exposed to sun light.

The solar cell module of the present disclosure includes a plurality of photoelectric conversion elements, where hole-blocking layers are not extended to each other but hole transport layers in at least two of the photoelectric conversion elements adjacent to each other are in a state of a continuous layer where the hole transport layers are extended to each other.

Next, the photoelectric conversion element will be described.

<Photoelectric Conversion Element>

A photoelectric conversion element is an element capable of converting optical energy to electric energy and has been applied for solar cells or photodiodes.

The photoelectric conversion element includes a first substrate, a first electrode, a hole blocking layer, an electron transport layer, a hole transport layer, a second electrode, a second substrate, and a sealing member.

<<First Substrate>>

A shape, structure, and size of the first substrate are not particularly limited and may be appropriately selected depending on the intended purpose.

The material of the first substrate is not particularly limited and may be appropriately selected depending on the intended purpose, as long as the material is a material having translucency and insulation. Examples of the material include substrates, such as glass, plastic films, and ceramics. Among the above-listed example, a substrate having heat resistance against a firing temperature is preferable in the case where a step of firing is included at the time when an electron transport layer is formed as described below. Moreover, the first substrate is preferably a substrate having flexibility.

<<First Electrode>>

A shape and size of the first electrode are not particularly limited and may be appropriately selected depending on the intended purpose.

A structure of the first electrode is not particularly limited and may be appropriately selected depending on the intended purpose. The structure of the first electrode may be a single layer structure or a structure where a plurality of materials are laminated.

A material of the first electrode is not particularly limited and may be appropriately selected depending on the intended purpose, as long as the material is a material having transparency to visible light and conductivity. Examples of the material include transparent conductive metal oxide, carbon, and metal.

Examples of the transparent conductive metal oxide include indium-tin oxide (referred to as "ITO" hereinafter), fluorine-doped tin oxide (referred to as "FTO" hereinafter), antimony-doped tin oxide (referred to as "ATO" hereinafter), niobium-doped tin oxide (referred to as "NTO" hereinafter), aluminium-doped zinc oxide, indium-zinc oxide, and niobium-titanium oxide.

Examples of the carbon include carbon black, carbon nanotubes, graphene, and fullerene.

Examples of the metal include gold, silver, aluminium, nickel, indium, tantalum, and titanium.

The above-listed examples may be used alone or in combination. Among the above-listed examples, transparent conductive metal oxide having high transparency is preferable, and ITO, FTO, ATO, and NTO are more preferable.

An average thickness of the first electrode is not particularly limited and may be appropriately selected depending on the intended purpose. The average thickness of the first electrode is preferably 5 nm or greater but 100 micrometers or less, and more preferably 50 nm or greater but 10 micrometers or less. In the case where a material of the first electrode is carbon or metal, the average thickness of the first electrode is preferably an average thickness with which translucency is easily obtained.

The first electrode can be formed by methods known in the art, such as sputtering, vapor deposition, and spraying. Moreover, the first electrode is preferably formed on the first substrate. A commercial product where a first electrode is formed on a first substrate in advance and is integrated with the first substrate can be used.

Examples of the integrated commercial product include FTO coated glass, ITO coated glass, zinc oxide/aluminium coated glass, an FTO coated transparent plastic film, and an ITO coated transparent plastic film. Another examples of the integrated commercial product include a glass substrate with a transparent electrode in which tin oxide or indium oxide is doped with a cation or anion having a different atomic value, and a glass substrate with a metal electrode having a structure to pass through light, such as in the form of a mesh or stripes.

The above-listed examples may be used alone, or a mixture, or a laminate. Moreover, a metal lead wire may be used for the purpose of reducing an electric resistance value.

Examples of a material of the metal lead wire include aluminium, copper, silver, gold, platinum, and nickel.

For example, the metal lead wire is used in combination and formed on the substrate by vapor deposition, sputtering, or pressure bonding, followed by disposing a layer of ITO or FTO on the metal lead wire.

<<Hole Blocking Layer>>

The hole blocking layer is formed between the first electrode and the electron transport layer. The hole blocking layer is configured to transport electrons, which are generated by a photosensitizing compound and transported to the electron transport layer, to the first electrode and prevent from being in contact with the hole transport layer. The presence of the hole blocking layer can suppress flow of holes into the first electrode and prevent low output caused by recombination of electrons and holes. Since a solid photoelectric conversion element to which a hole transport layer is disposed has high speed of recombination between holes in the hole transport material and electrons on a surface of the electrode compared to a fluid-type photoelectric conversion element, an effect obtainable by forming the hole blocking layer is significant.

A material of the hole blocking layer is not particularly limited and may be appropriately selected depending on the intended purpose, as long as the material of the hole blocking layer is a material that is transparent to visible light and has electron transporting properties. Examples of the material of the hole blocking layer include a single semiconductor (e.g., silicon and germanium), a compound semiconductor (e.g., chalcogenide of metal), and a compound having a perovskite structure. Examples of the chalcogenide of metal include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium. Other examples of the compound semiconductor include: phosphides of zinc, gallium, indium, and cadmium; gallium arsenide; copper-indium-selenide; and copper-indium-sulfide. Examples of the compound having a perovskite structure include strontium titanate, calcium titanate, sodium titanate, barium titanate, and potassium niobate. Among the above-listed examples, oxide semiconductors are preferable, titanium oxide, niobium oxide, magnesium oxide, aluminium oxide, zinc oxide, tungsten oxide, and tin oxide are more preferable, and titanium oxide is more preferable. The above-listed examples may be used alone or in combination. The above-listed materials may be used as a single layer or a laminate. Moreover, a crystal structure of any of the above-listed semiconductors is not particularly limited and may be appropriately selected depending on the intended purpose. The crystal structure thereof may be a single crystal, polycrystalline, or amorphous.

A film forming method of the hole blocking layer is not particularly limited and may be appropriately selected depending on the intended purpose. Examples of the film forming method of the hole blocking layer include a sol-gel method that is wet film formation, a hydrolysis method from titanium tetrachloride, and sputtering that is dry film formation. Among the above-listed examples, sputtering is preferable. When the film forming method of the hole blocking layer is sputtering, a film density can be made sufficiently high and current loss can be suppressed.

A film thickness of the hole blocking layer is not particularly limited and may be appropriately selected depending on the intended purpose. The film thickness of the hole blocking layer is preferably 5 nm or greater but 1 micrometer or less. In case of a film formed by a wet system, the film thickness is more preferably 500 nm or greater but 700 nm or less. In case of a film formed by a dry system, the film thickness is more preferably 5 nm or greater but 30 nm or less.

<<Electron Transport Layer>>

The electron transport layer is formed for the purpose of transporting electrons generated by the photosensitizing compound to the first electrode or the hole blocking layer. Therefore, the electron transport layer is preferably arranged adjacent to the first electrode or the hole blocking layer.

A structure of the electron transport layer is not particularly limited and may be appropriately selected depending on the intended purpose. Within at least two photo-electric conversion elements adjacent to each other, the electron transport layers are preferably not extended to each other. Electron diffusion is suppressed to reduce electric current leakage when the electron transport layers are not extended to each other. Therefore, such a structure is advantageous in view of improvement of light resistance. Moreover, a structure of the electron transport layer may be a continuous single layer, or a multiple layer in which a plurality of layers are laminated.

The electron transport layer includes an electron transport material, and may further include other materials according to the necessity.

The electron transport material is not particularly limited and may be appropriately selected depending on the intended purpose. The electron transport material is preferably a semiconductor material.

It is preferable that the semiconductor material be in the shape of particles and a porous film be formed by joining the particles together. A photosensitizing compound is chemically or physically adsorbed on surfaces of the semiconductor particles constituting the porous electron transport layer.

The semiconductor material is not particularly limited and may be selected from materials known in the art. Examples of the semiconductor material include a single semiconductor, a compound semiconductor, and a compound having a perovskite structure.

Examples of the single semiconductor include silicon and germanium.

Examples of the compound semiconductor include chalcogenide of metal. Specific examples thereof include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium. Other examples of the compound semi-conductor include: phosphides of zinc, gallium, indium, and cadmium; gallium arsenide; copper-indium-selenide; and copper-indium-sulfide.

Examples of the compound having a perovskite structure include strontium titanate, calcium titanate, sodium titanate, barium titanate, and potassium niobate.

Among the above-listed examples, oxide semiconductors are preferable, and particularly, titanium oxide, zinc oxide, tin oxide, and niobium oxide are more preferable. When the electron transport material of the electron transport layer is titanium oxide, a conduction band is high and high open-circuit voltage can be obtained. Moreover, a refractive index is high and high short-circuit current can be obtained owing to a light confinement effect. Moreover, use of titanium oxide is advantageous because a di-electric constant is high and mobility is high thus a high fill factor can be obtained.

The above-listed examples may be used alone or in combination. Moreover, a crystal structure of any of the above-listed semiconductors is not particularly limited and may be appropriately selected depending on the intended purpose. The crystal structure thereof may be a single crystal, polycrystalline, or amorphous.

A number average particle diameter of primary particles of the semiconductor material is not particularly limited and may be appropriately selected depending on the intended purpose. The number average particle diameter thereof is preferably 1 nm or greater but 100 nm or less, and more preferably 5 nm or greater but 50 nm or less. Moreover, a semiconductor material having the lager particle size than the number average particle diameter may be mixed or laminate. Use of such a semiconductor material may improve a conversion efficiency owing to an effect of scattering incident light. In this case, the number average particle diameter is preferably 50 nm or greater but 500 nm or less.

An average thickness of the electron transport layer is not particularly limited and may be appropriately selected depending on the intended purpose. The average thickness of the electron transport layer is preferably 50 nm or greater but 100 micrometers or less, more preferably 100 nm or greater but 50 micrometers or less, and even more preferably 120 nm or greater but 10 micrometers or less. When the average thickness of the electron transport layer is within the preferable range, an amount of the photosensitizing compound per unit projected area can be sufficiently secured, a capturing rate of light can be maintained high, a diffusion length of injected electrons is not easily increased, and loss due to recombination of charge can be maintained low. Therefore, the electron transport layer having the average thickness falling in the preferable range is advantageous.

A production method of the electron transport layer is not particularly limited and may be appropriately selected depending on the intended purpose. Examples of the production method thereof include a method where a thin film is formed in vacuum, such as sputtering, and a wet film forming method. Among the above-listed example, in view of a production cost, a wet film forming method is preferable, and a method where a paste in which powder or sol of a semiconductor material is dispersed is prepared, and the paste is applied onto a first electrode serving as an electron-collecting electrode substrate or a hole blocking layer is more preferable.

The wet film forming method is not particularly limited and may be appropriately selected depending on the intended purpose. Examples of the wet film forming method include dip coating, spray coating, wire bar coating, spin coating, roller coating, blade coating, and gravure coating.

As a wet printing method, for example, various methods, such as relief printing, offset printing, gravure printing, intaglio printing, rubber plate printing, and screen printing, can be used.

Examples of a method for producing a dispersion liquid of the semiconductor material include a method where the semiconductor material is mechanically pulverized using a milling device known in the art. According to the method as mentioned, a particular semiconductor material alone or a mixture of the semi-conductor material and a resin is dispersed in water or a solvent to thereby produce a dispersion liquid of the semiconductor material.

Examples of the resin include a polymer or copolymer of a vinyl compound (e.g., styrene, vinyl acetate, acrylic acid ester, and methacrylic acid ester), a silicone resin, a phenoxy resin, a polysulfone resin, a polyvinyl butyral resin, a polyvinyl formal resin, a polyester resin, a cellulose ester resin, a cellulose ether resin, a urethane resin, a phenol resin, an epoxy resin, a polycarbonate resin, a polyarylate resin, a polyamide resin, and a polyimide resin. The above-listed examples may be used alone or in combination.

Examples of the solvent include water, an alcohol solvent, a ketone solvent, an ester solvent, an ether solvent, an amide solvent, a halogenated hydrocarbon solvent, and a hydrocarbon solvent.

Examples of the alcohol solvent include methanol, ethanol, isopropyl alcohol, and alpha-terpineol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetoamide, and N-methyl-2-pyrrolidone.

Examples of the halogenated hydrocarbon solvent include dichloromethane, chloroform, bromoform, methyl iodide, dichloroethane, tirchloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

The above-listed examples may be used alone or in combination.

In order to prevent reaggregation of particles, acid, a surfactant, or a chelating agent may be added to a dispersion liquid including the semiconductor material or a paste including the semiconductor material obtained by a sol-gel method.

Examples of the acid include hydrochloric acid, nitric acid, and acetic acid.

Examples of the surfactant include polyoxyethylene octylphenyl ether.

Examples of the chelating agent include acetyl acetone, 2-aminoethanol, and ethylene diamine.

Moreover, it is also effective to add a thickener for the purpose of improving film forming ability.

Examples of the thickener include polyethylene glycol, polyvinyl alcohol, and ethyl cellulose.

After applying the semiconductor material, the semiconductor material may be subjected to firing, irradiation with microwaves or an electron beam, or laser beam irradiation in order to electrically contact particles of the semiconductor materials one another to improve the film strength or adhesion to the substrate. The above-listed processes may be performed alone or in combination.

In the case where the electron transport layer formed of the semiconductor material is fired, a firing temperature is not particularly limited and may be appropriately selected depending on the intended purpose. Since resistance of the substrate may become too high or a material may be melted when the temperature is too high, the firing temperature is preferably 30 degrees Celsius or higher but 700 degrees Celsius or lower, and more preferably 100 degrees Celsius or higher but 600 degrees Celsius or lower. Moreover, firing duration is not particularly limited and may be appropriately selected depending on the intended purpose. The firing duration is preferably 10 minutes or longer but 10 hours or shorter.

In the case where the electron transport layer formed of the semiconductor material is irradiated with microwaves, irradiate duration is not particularly limited and may be appropriately selected depending on the intended purpose. The irradiation duration is preferably 1 hour or shorter. In this case, irradiation may be performed from the side where the electron transport layer is formed, or from the side where the electron transport layer is not formed.

After firing the electron transport layer formed of the semiconductor material, for example, chemical plating using a titanium tetrachloride aqueous solution or a mixed solution with an organic solvent, or electrochemical plating using a titanium trichloride aqueous solution may be performed for the purpose of enhancing an electron injection efficiency from the below-mentioned photosensitizing compound to the semiconductor material.

The film obtained by firing the semiconductor material having a particle diameter of several tens nanometers can form a porous structure. Such a nanoporous structure has an extremely high surface area and the surface area can be represented by a roughness factor. The roughness factor is a numerical value representing an actual area of the inner side of pores relative to an area of the semiconductor particles applied onto the first substrate. Accordingly, the larger value of the roughness factor is more preferable. In view of a relationship with the average thickness of the electron transport layer, the roughness factor is preferably 20 or greater.

<<Photosensitizing Compound>>

A photosensitizing compound is adsorbed on a surface of the semiconductor material constituting the electron transport layer in order to further improve output or a photoelectric conversion efficiency.

The photosensitizing compound is not particularly limited and may be appropriately selected depending on the intended purpose, as long as the photosensitizing compound is a compound that is photoexcited by excitation light emitted to the photoelectric conversion element. Examples of the photosensitizing compound include compounds known in the art below.

Specific examples thereof include metal complex compounds, cumarin compounds disclosed in J. Phys. Chem. C, 7224, Vol. 111 (2007), polyene compounds disclosed in Chem. Commun., 4887 (2007), indoline compounds disclosed in J. Am. Chem. Soc., 12218, Vol. 126 (2004), Chem. Commun., 3036 (2003), and Angew. Chem. Int. Ed., 1923, Vol. 47 (2008), thiophene compounds disclosed in J. Am. Chem. Soc., 16701, Vol. 128 (2006), and J. Am. Chem. Soc., 14256, Vol. 128 (2006), cyanine dyes, merocyanine dyes, 9-arylxanthene compounds, triaryl methane compounds, phthalocyanine compounds disclosed in J. Phys. Chem., 2342, Vol. 91 (1987), J. Phys. Chem. B, 6272, Vol. 97 (1993), Electroanal. Chem., 31, Vol. 537 (2002) J. Porphyrins Phthalocyanines, 230, Vol. 3 (1999), Angew. Chem. Int. Ed., 373, Vol. 46 (2007), and Langmuir, 5436, Vol. 24 (2008), and porphyrin compounds.

Among the above-listed examples, a metal complex compound, a cumarin compound, a polyene compound, an indoline compound, and a thiophene compound are preferable. The compounds represented by Structural Formulae (1), (2), and (3) below available from MITSUIBISHI PAPER MILLS LIMITED, and moreover a compound represented by General Formula (3) below are more preferable. The above-listed photosensitizing compounds may be used alone or in combination.

[Chem.1]

Structural Formula (1)

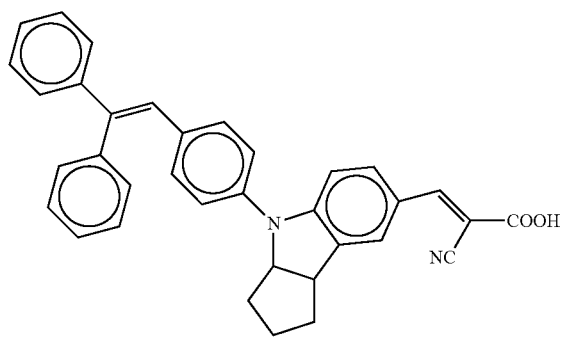

[Chem.2]

Structural Formula (2)

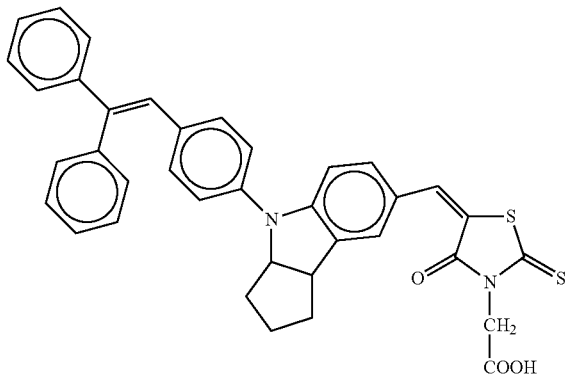

[Chem.3]

Structural Formula (3)

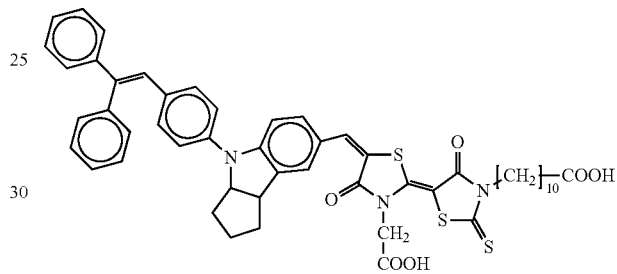

[Chem.4]

Structural Formula (3)

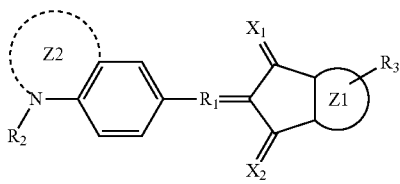

(In the formulae above, X1 and X2 are each an oxygen atom, a sulfur atom, and a selenium atom; R1 is a methine group that may have a substituent, where specific examples of the substituent include an aryl group (e.g., a phenyl group and a naphthyl group) and a hetero cycle (e.g., a thienyl group and a furyl group); R2 is an alkyl group that may have a substituent, an aryl group, or a heterocyclic group, where examples of the alkyl group include a methyl group, an ethyl group, a 2-propyl group, and a 2-ethylhexyl group, and examples of the aryl group and heterocyclic group includes the groups listed above; R3 is an acid group, such as carboxylic acid, sulfonic acid, phosphonic acid, boronic acid, and phenols; and Z1 and Z2 are each a substituent for forming a ring structure where examples of Z1 include a condensation hydrocarbon-based compound (e.g., a benzene ring and a naphthalene ring) and a heteroring (e.g., a thiophene ring, and a furan ring) all of which may have a substituent, specific examples thereof include the above-listed alkyl group, and an alkoxy group (e.g., a methoxy group, an ethoxy group, and a 2-isopropoxy group), and examples of Z2 include the following (A-1) to (A-22))

[Chem. 5]
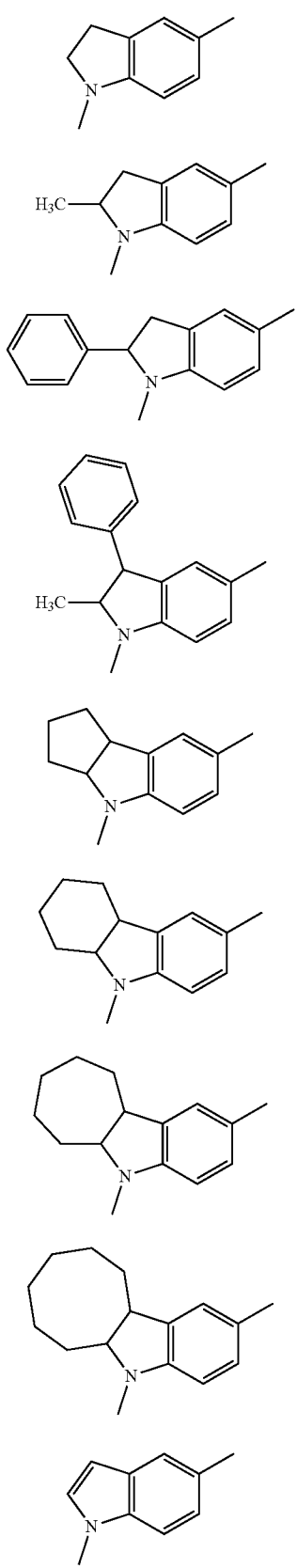
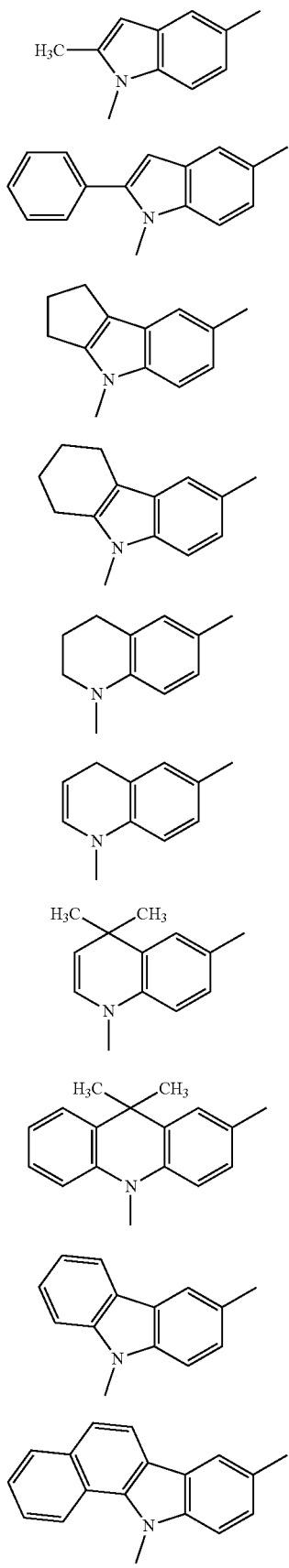

(A-20)
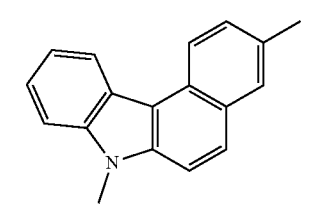
(A-21)
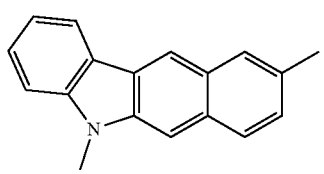
(A-22)
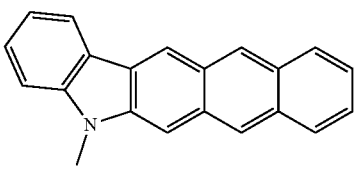
Specific examples of the photosensitizing compound represented by General Formula (3) include the following (B-1) to (B-28). However, the photosensitizing compound is not limited to the following examples.
[Chem.6]
(B-1)
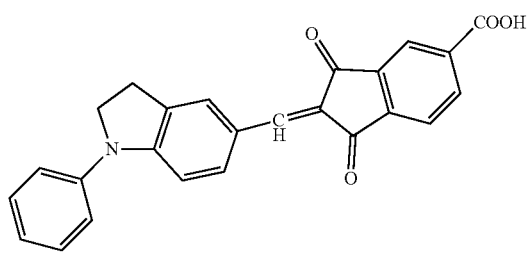
(B-2)
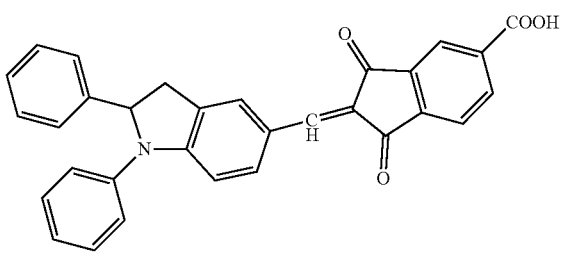
(B-3)
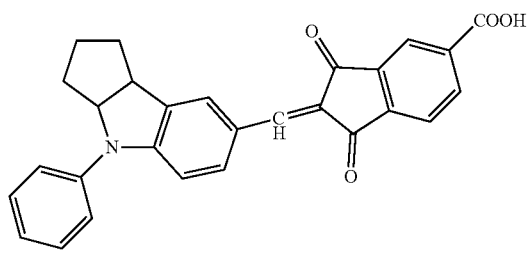
(B-4)
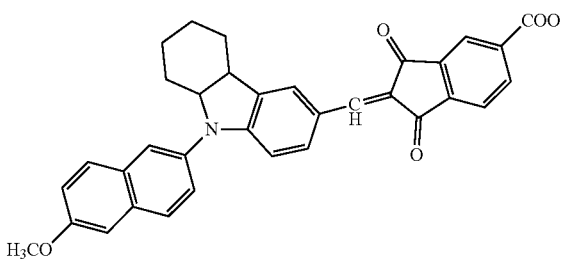
(B-5)
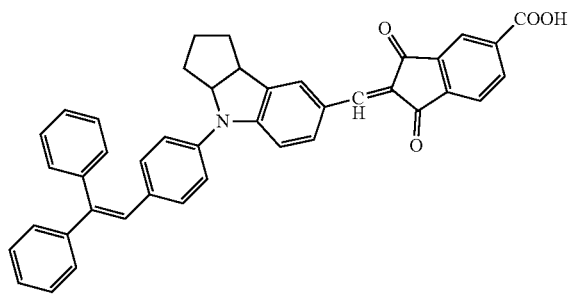
(B-6)
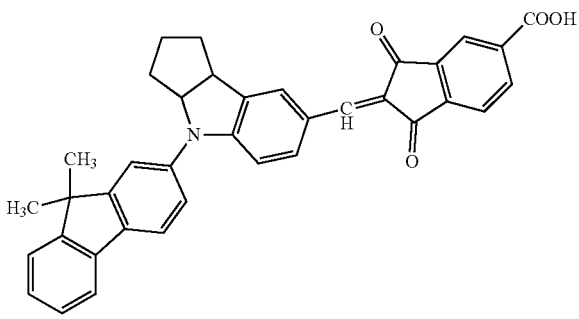

-continued
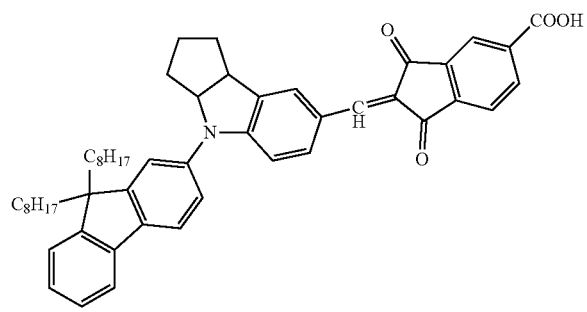
(B-7)
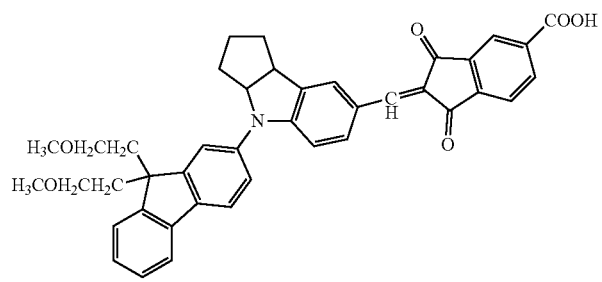
(B-8)
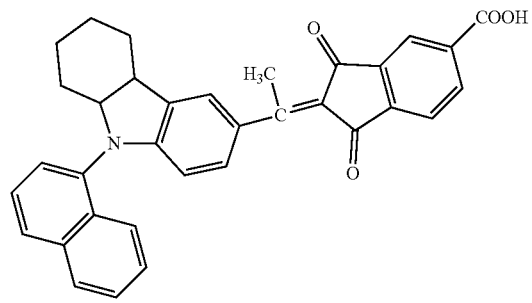
(B-9)
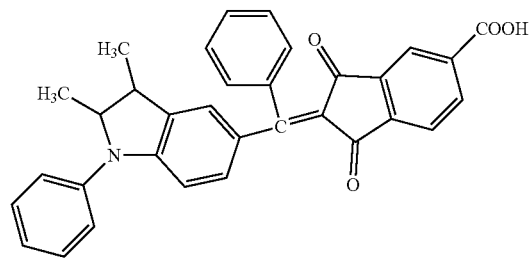
(B-10)
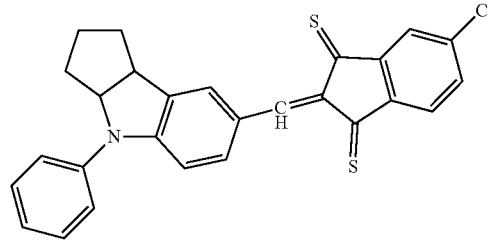
(B-11)
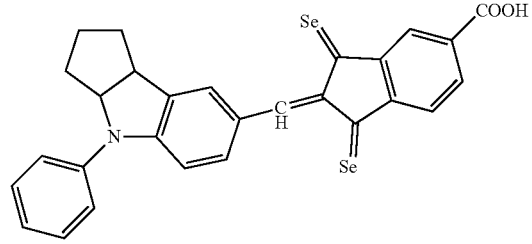
(B-12)
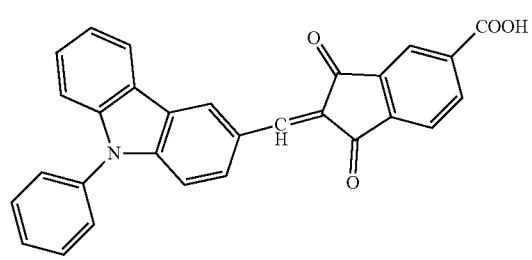
(B-13)
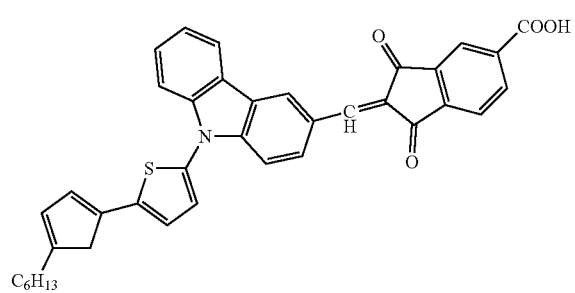
(B-14)
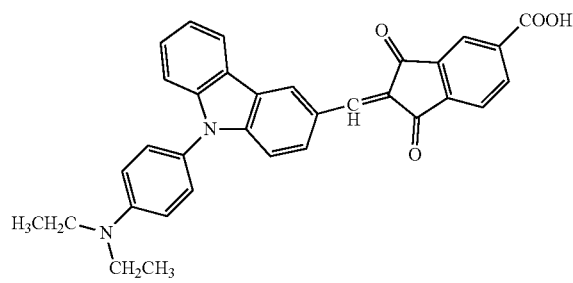
(B-15)
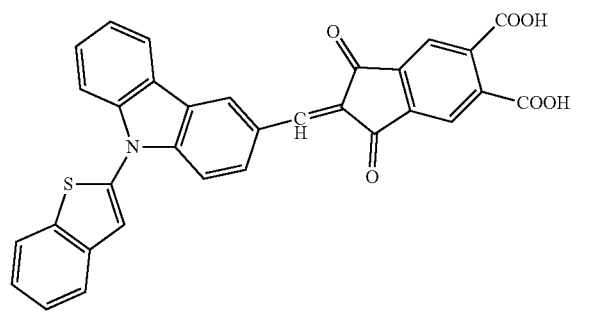
(B-16)

-continued
(B-17)
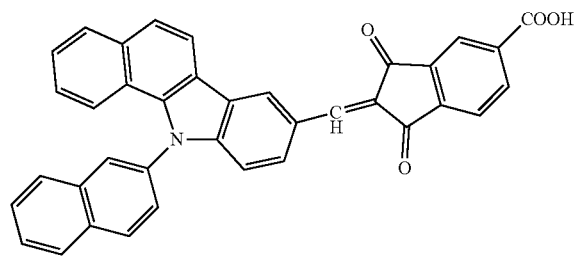
(B-18)
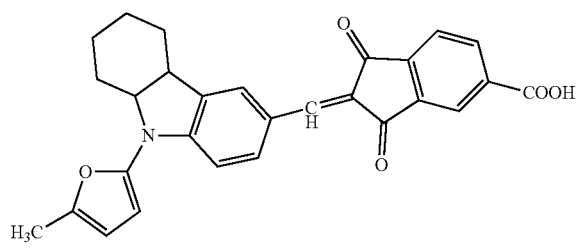
(B-19)
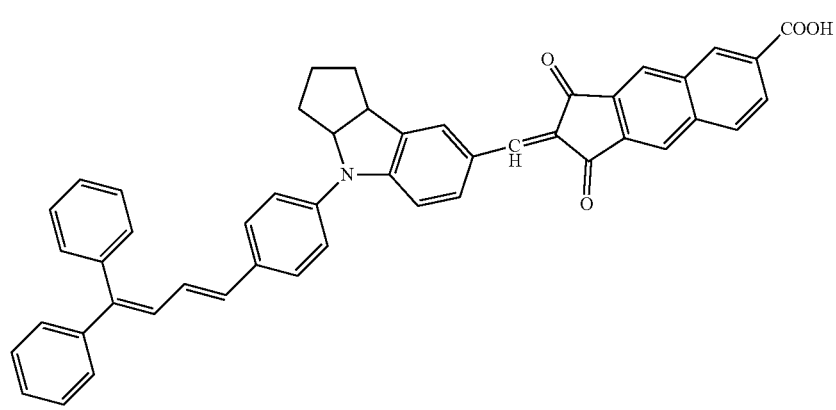
(B-20)
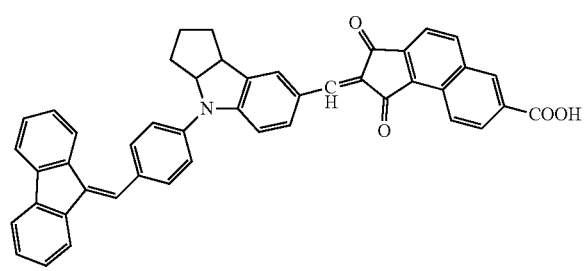
(B-21)
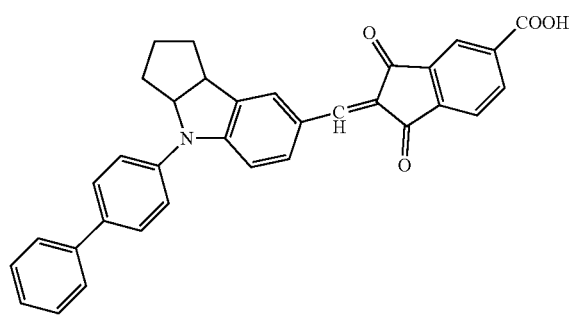
(B-22)
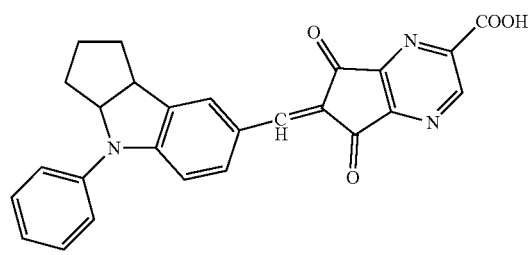
(B-23)
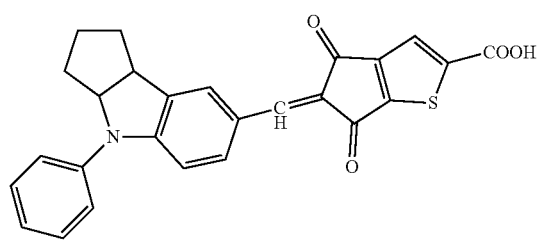
(B-24)
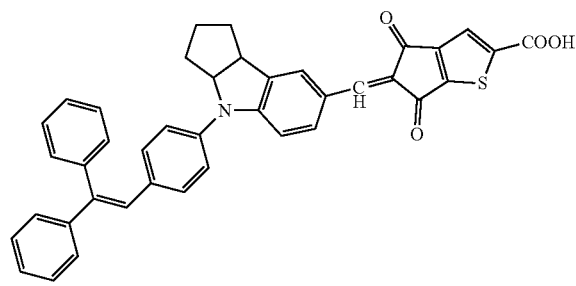
(B-25)
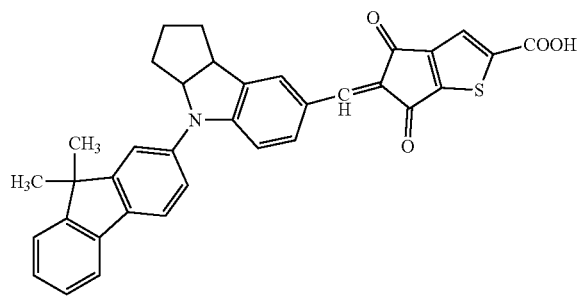

(B-26)
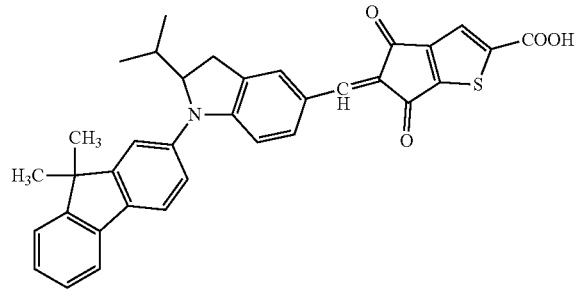

(B-27)
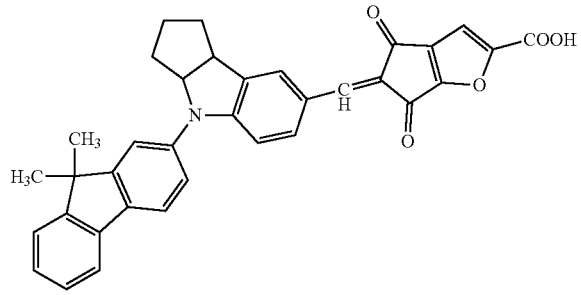

(B-28)
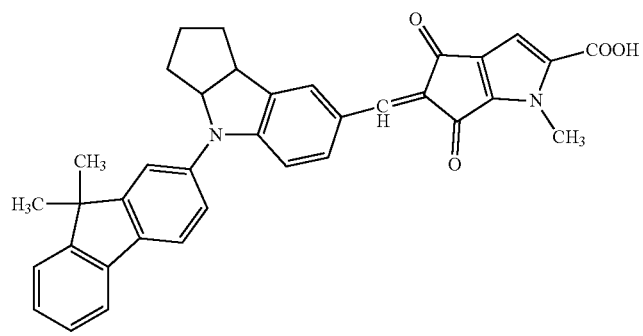

As a method for making the photosensitizing compound adsorbed on a surface of the semiconductor material of the electron transport layer, a method where the electron transport layer including the semiconductor material is immersed in a solution or dispersion liquid of the photosensitizing compound, or a method where a solution or dispersion liquid of the photosensitizing compound is applied onto the electron transport layer to adsorb the photosensitizing compound can be used. In case of the method of immersing the electron transport layer to which the semiconductor material is formed in a solution or dispersion liquid of the photosensitizing compound, an immersion method, a dipping method, a roller method, or an air knife method can be used. In case of the method for applying a solution or dispersion liquid of the photosensitizing compound to the electron transport layer to make the photosensitizing compound adsorbed on the electron transport layer, wire bar coating, slide hopper coating, extrusion coating, curtain coating, spin coating, or spray coating can be used. Moreover, it is also possible to adsorb the photosensitizing compound on the electron transport layer in a supercritical fluid using carbon dioxide etc.

When the photosensitizing compound is adsorbed on the semiconductor material, a condensing agent may be used in combination.

The condensing agent may be an agent that exhibits a catalystic function to physical or chemical bind a photosensitizing compound to a surface of a semiconductor material, or an agent that exhibits a stoichiometric function to move a chemical equilibrium advantageously. Moreover, thiol or a hydroxyl compound may be added as a condensation auxiliary.

Examples of the solvent in which the photosensitizing compound is dissolved or dispersed include water, an alcohol solvent, a ketone solvent, an ester solvent, an ether solvent, an amide solvent, a halogenated hydrocarbon solvent, and a hydrocarbon solvent.

Examples of the alcohol solvent include methanol, ethanol, and isopropyl alcohol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetoamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

The above-listed examples may be used alone or in combination.

Since there is a photosensitizing compound that may function more effectively when aggregates between compounds are prevented, depending on a kind of the photosensitizing compound for use, an aggregate dissociating agent may be used in combination.

The aggregate dissociating agent is not particularly limited and may be appropriately selected depending on a dye for use. The aggregate dissociating agent is preferable a steroid compound (e.g., cholic acid and chenodexycholic acid), long-chain alkyl carboxylic acid, or long-chain alkyl phosphonic acid.

An amount of the aggregate dissociating agent is preferably 0.01 parts by mass or greater but 500 parts by mass or less, and more preferably 0.1 parts by mass or greater but 100 parts by mass or less, relative to 1 part by mass of the photosensitizing compound.

A temperature at the time when the photosensitizing compound alone or a combination of the photosensitizing compound and the aggregate dissociating agent are adsorbed on a surface of the semiconductor material constituting the electron transport layer is preferably −50 degrees Celsius or higher but 200 degrees Celsius or lower. The adsorption duration is preferably 5 seconds or longer but 1,000 hours or shorter, more preferably 10 seconds or longer but 500 hours or shorter, and even more preferably 1 minute or longer but 150 hours or shorter. The process of adsorption is preferably performed in the dark. Moreover, the process of adsorption may be performed with still standing or with stirring.

A method for stirring is not particularly limited and may be appropriately selected depending on the intended purpose. Examples of the method include methods using a stirrer, a ball mill, a paint conditioner, a sand mill, Attritor, a disperser, and ultrasonic disperser.

<<Hole Transport Layer>>

As the hole transport layer, any material known in the art can be used as long as the hole transport layer has a function of transporting holes. Examples of the material include an electrolyte solution obtained by dissolving a redox couple, a gel electrolyte in which a polymer matrix is impregnated with a liquid obtained by dissolving a redox couple in an organic solvent, a molten salt including a redox couple, a solid electrolyte, an inorganic hole transport material, and an organic hole transport material. Among the above-listed examples, an electrolyte solution or gel electrolyte may be used, but a solid electrolyte is preferable, and an organic hole transport material is more preferable.

The hole transport layer includes a basic compound represented by General Formula (1) or General Formula (2) below.

[Chem. 7]

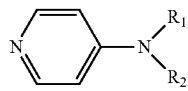

General Formula (1)

(In the formula above, R1 and R2 are each independently an alkyl group or an aromatic hydrocarbon group, where R1 and R2 may be identical groups or different groups, or R1 and R2 may be bonded together to form a heterocycle group including a nitrogen atom.)

[Chem. 8]

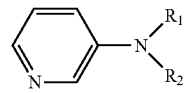

General Formula (2)

(In the formula above, R1 and R2 are each independently an alkyl group or an aromatic hydrocarbon group, where R1 and R2 may be identical groups or different groups, or R1 and R2 may be bonded together to form a heterocycle group including a nitrogen atom.)

The hole transport layer preferably includes a basic compound represented by General Formula (1) or General Formula (2). The hole transport layer including the basic compound represented by General Formula (1) or General Formula (2) is advantageous in view of improvement of output stability of a photoelectric conversion element, and particularly in view of a reduction in fluctuations of output properties with light of low illuminance and stable power generation.

Specific exemplary compounds of the basic compound represented by General Formula (1) or General Formula (2) will be presented below, but the basic compound for use in the present disclosure is not limited to the examples below.

[Chem.9]

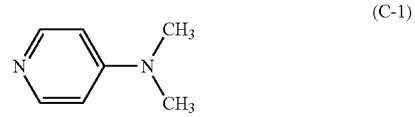
(C-1)

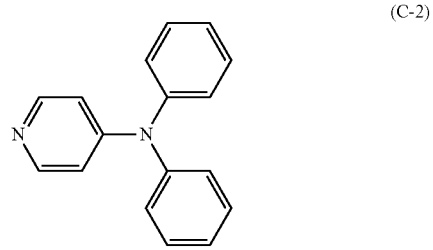
(C-2)

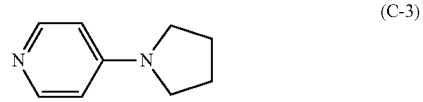
(C-3)

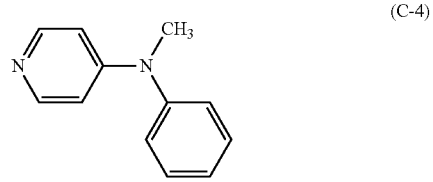
(C-4)

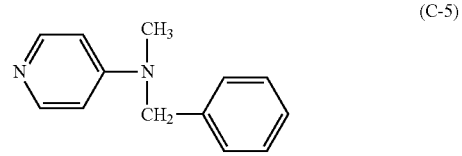
(C-5)

(C-6)

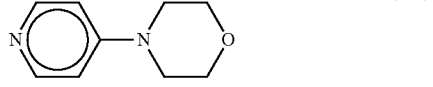
(C-7)

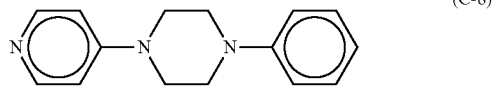
(C-8)

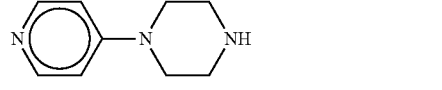
(C-9)

(C-10) 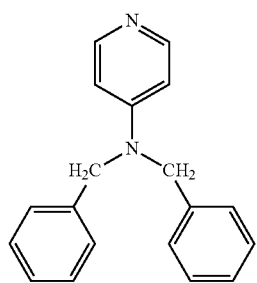
(C-11) 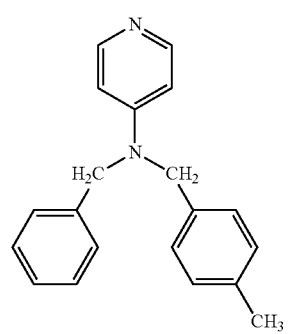
(C-12) 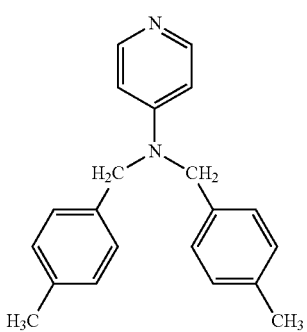
(C-13) 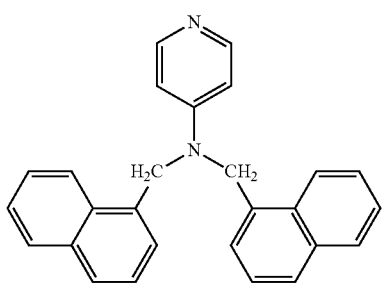
(C-14) 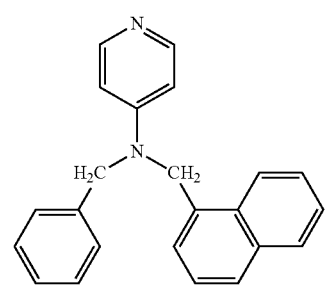
(C-15) 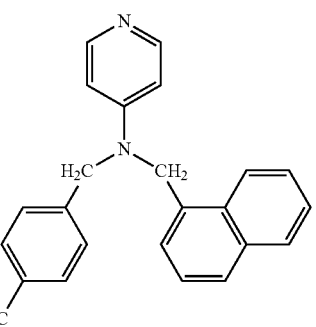
(C-16) 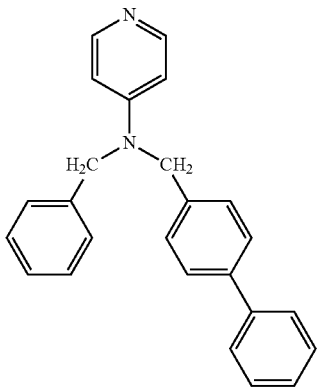
(C-17) 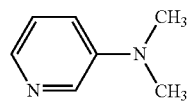
(C-18) 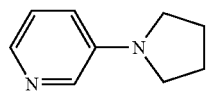
(C-19) 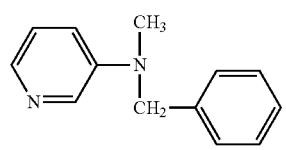
(C-20) 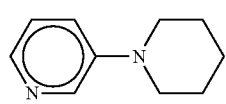
(C-21) 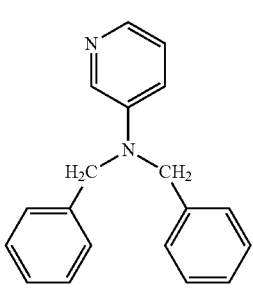

(C-22)
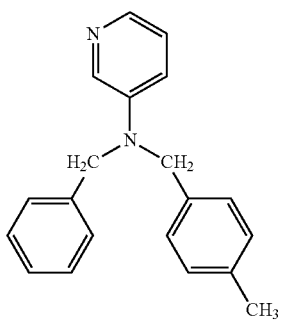

(C-23)
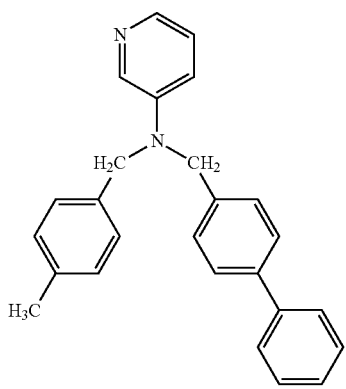

(C-24)
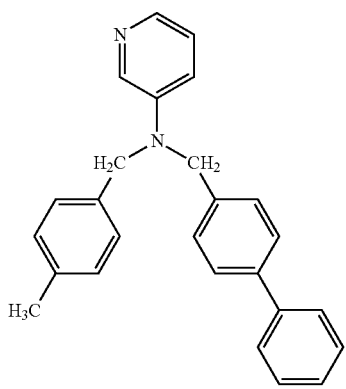

An amount of the basic compound represented by General Formula (1) or General Formula (2) in the hole transport layer is preferably 1 part by mass or greater but 50 parts by mass or less, and more preferably 10 parts by mass or greater but 30 parts by mass or less, relative to 100 parts by mass of the hole transport material. When the amount of the basic compound is within the above-mentioned preferable range, high open-circuit voltage can be maintained, high output can be obtained, and high stability and durability can be obtained even after using for a long period in various environments.

The hole transport layer includes the hole transport material or a p-type semiconductor material in order to obtain a function of transporting holes. As the hole transport material or p-type semiconductor material, any of organic hole transport compounds known in the art can be used. Specific examples of the hole transport material or p-type semiconductor material include an oxadiazole compound, a triphenylmethane compound, a pyrazoline compound, a hydrazone compound, a tetraaryl benzidine compound, a stilbene compound, and a spiro compound.

Among the above-listed examples, a spiro compound is more preferable.

As the spiro compound, a compound represented by General Formula (4) below is preferable.

[Chem. 10]

General Formula (4)

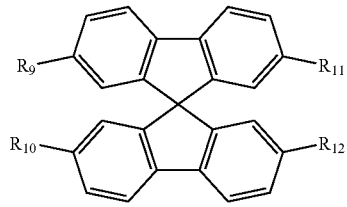

(In the formula above, R9 to R12 are each a substituted amino group, such as a dimethylamino group, a diphenylamino group, and a napthyl-4-trylamino group.)

Specific examples of the spiro compound include (D-1) to (D-22) below, but the spiro compound is not limited to the following examples.

[Chem.11]

(D-1)
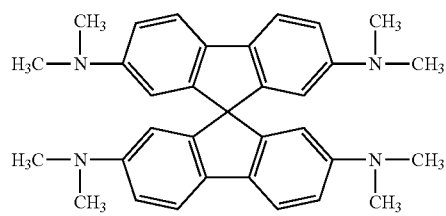

(D-2)
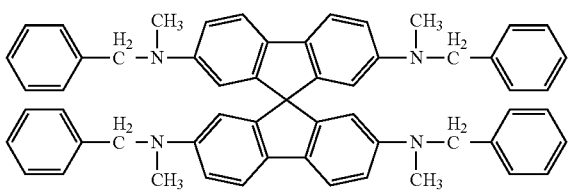

-continued
(D-3)
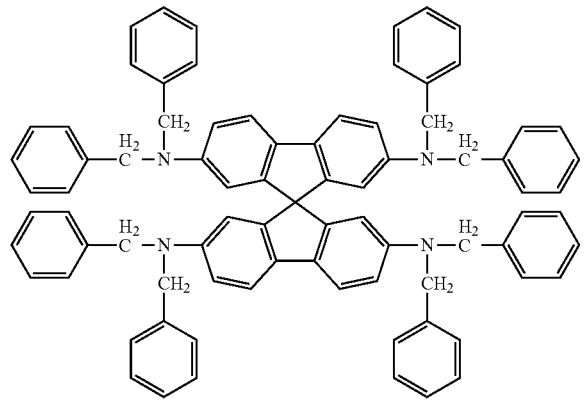
(D-4)
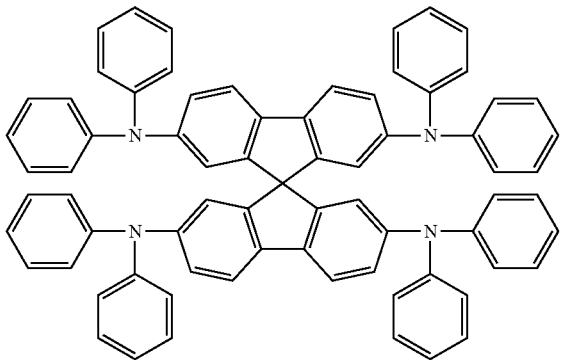
(D-5)
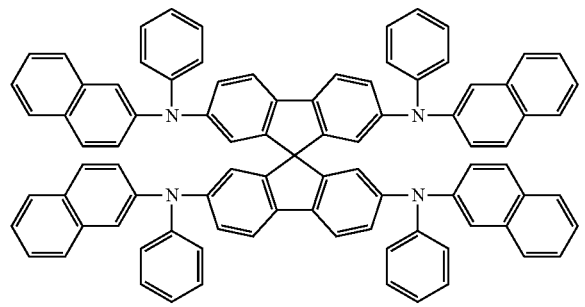
(D-6)
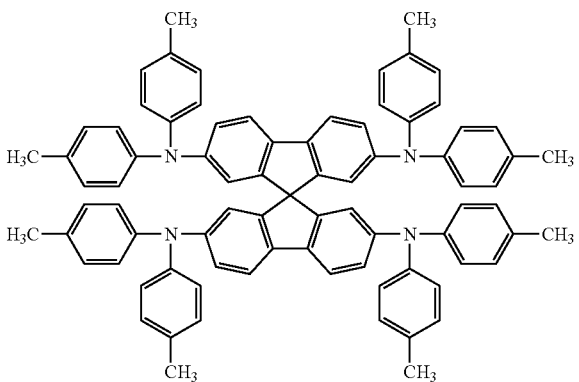
(D-7)
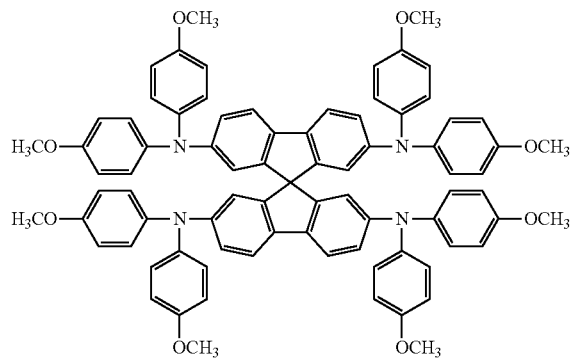
(D-8)
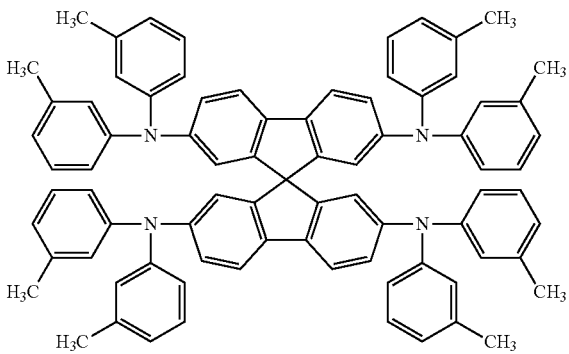
(D-9)
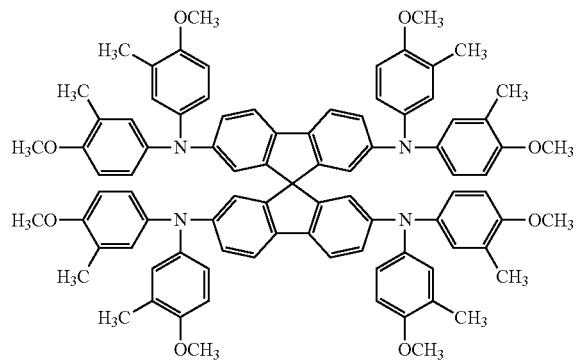
(D-10)
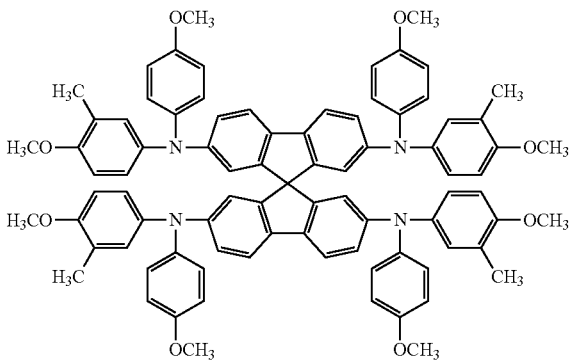

(D-11)
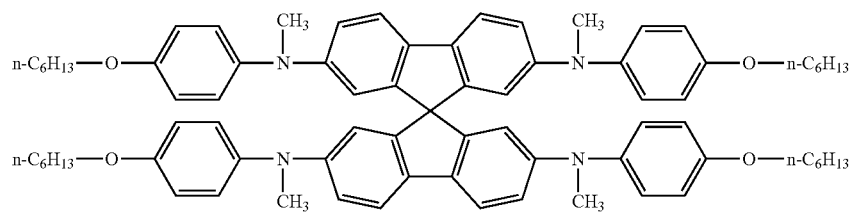
(D-12) (D-13)
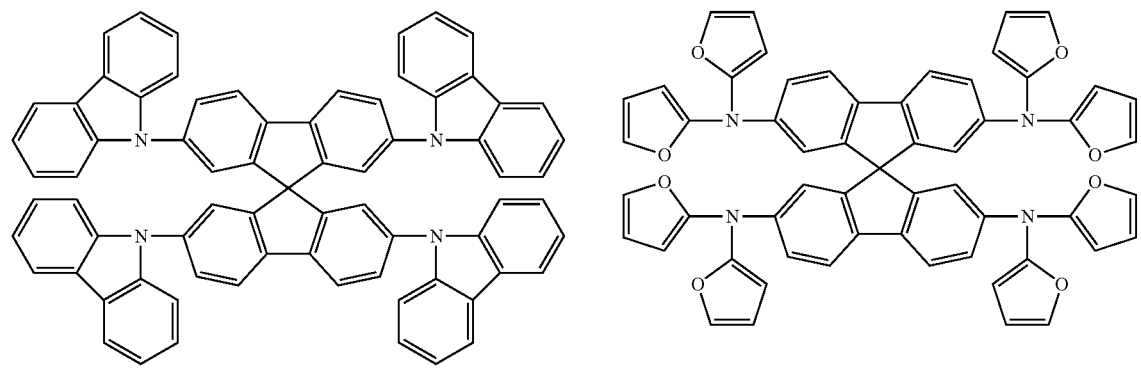
(D-14) (D-15)
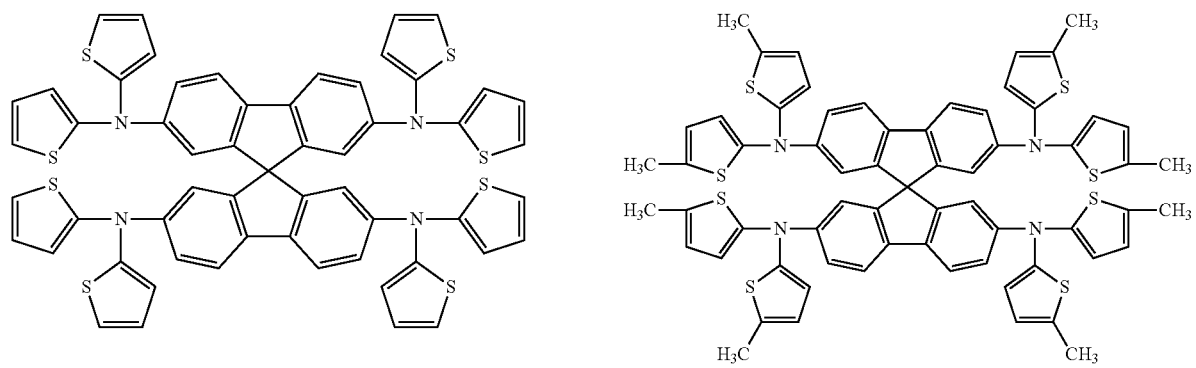
(D-16) (D-17)
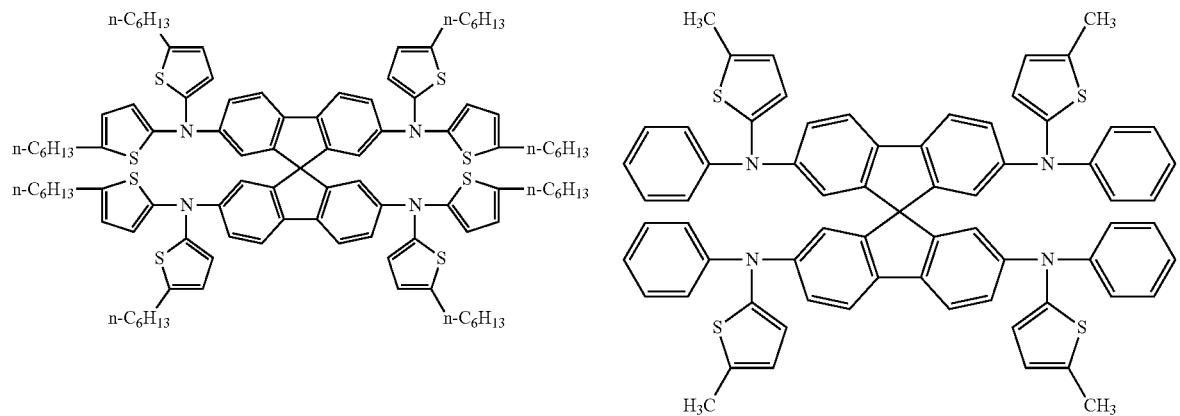

-continued

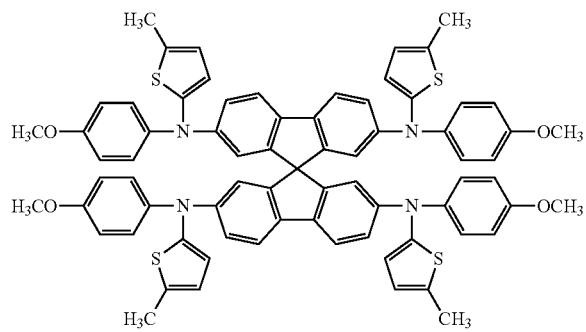
(D-18)

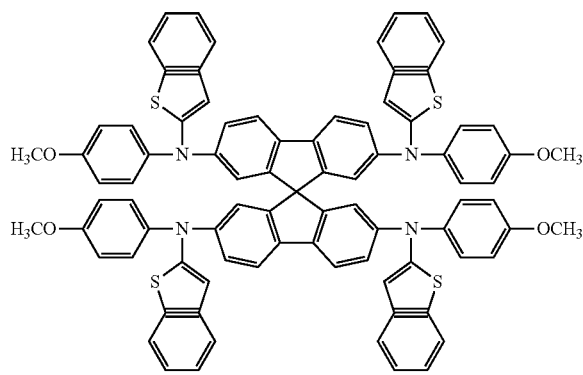
(D-19)

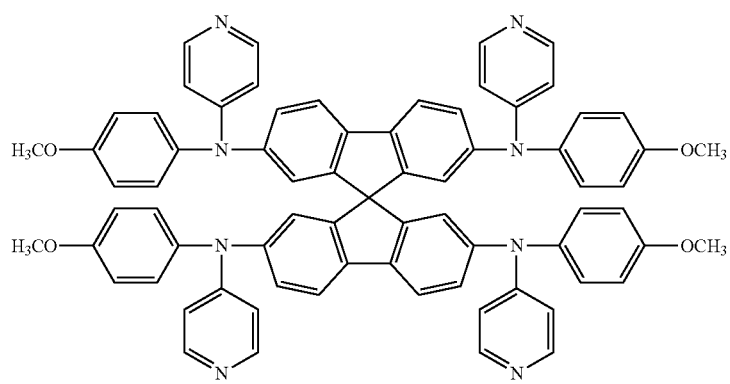
(D-20)

As well as the above-listed spiro compounds have high hole mobility, two benzidine skeletons are spirally bonded to form an electron cloud a shape of which is close to a sphere and hopping conductivity between molecules is excellent. Therefore, the spiro compounds exhibit excellent photoelectric conversion properties. Moreover, the spiro compounds are dissolved in various organic solvents because solubility of the spiro compounds is high. Since the spiro compounds are amorphous (irregular-shaped compounds that do not have a crystal structure), the spiro compounds tend to be densely filled in a porous electron transport layer. Since the spiro compounds do not absorb light of 450 nm or longer, furthermore, light absorption of the photosensitizing compound can be effectively performed and therefore the spiro compounds are particularly preferable for a solid dye-sensitized solar cell.

In addition to the hole transport material or the basic compound, an oxidizing agent is preferably added to the hole transport layer. The addition of the oxidizing agent can improve conductivity and enhance durability or stability of output properties.

Examples of the oxidizing agent include tris(4-bromophenyl)ammoniumyl hexachloroantimonate, silver hexafluoroantimonate, nitrosonium tetrafluoroborate, silver nitrate, and a metal complex. Among the above-listed examples, a metal complex is more preferable. Use of the metal complex as the oxidizing agent is advantageous because the metal complex has high solubility to an organic solvent and a large amount of the oxidizing agent can be added.

The metal complex is made up of a metal cation, a ligand, and an anion.

Examples of the metal cation includes cations of chromium, manganese, iron, cobalt, nickel, copper, molybdenum, ruthenium, rhodium, palladium, silver, tungsten, rhenium, osmium, iridium, gold, and platinum. Among the above-listed examples, cations of cobalt, iron, nickel, and copper are preferable, and a trivalent cobalt complex is more preferable. The ligand is preferably a ligand including a 5- and/or 6-membered heterocycle including at least one nitrogen atom, where the ligand may include a substituent. Specific examples of the ligand are listed below, but the ligand is not limited to the following examples.

[Chem.12]

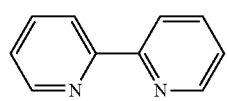
(E-1)

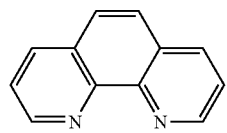
(E-2)

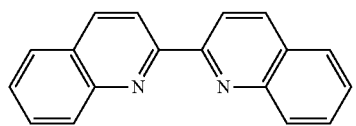
(E-3)

-continued
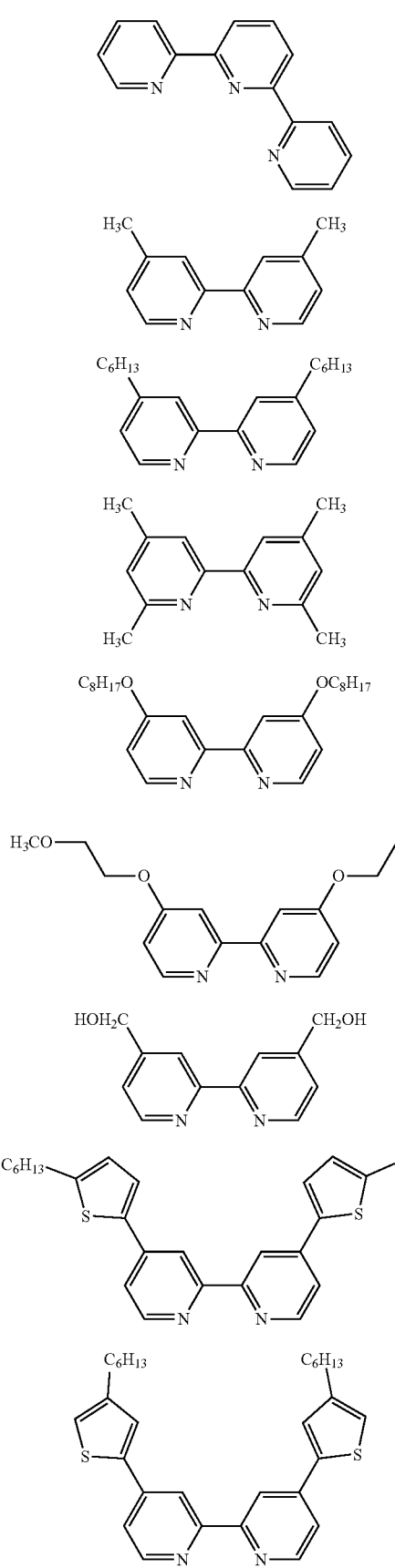
(E-4)
(E-5)
(E-6)
(E-7)
(E-8)
(E-9)
(E-10)
(E-11)
(E-12)
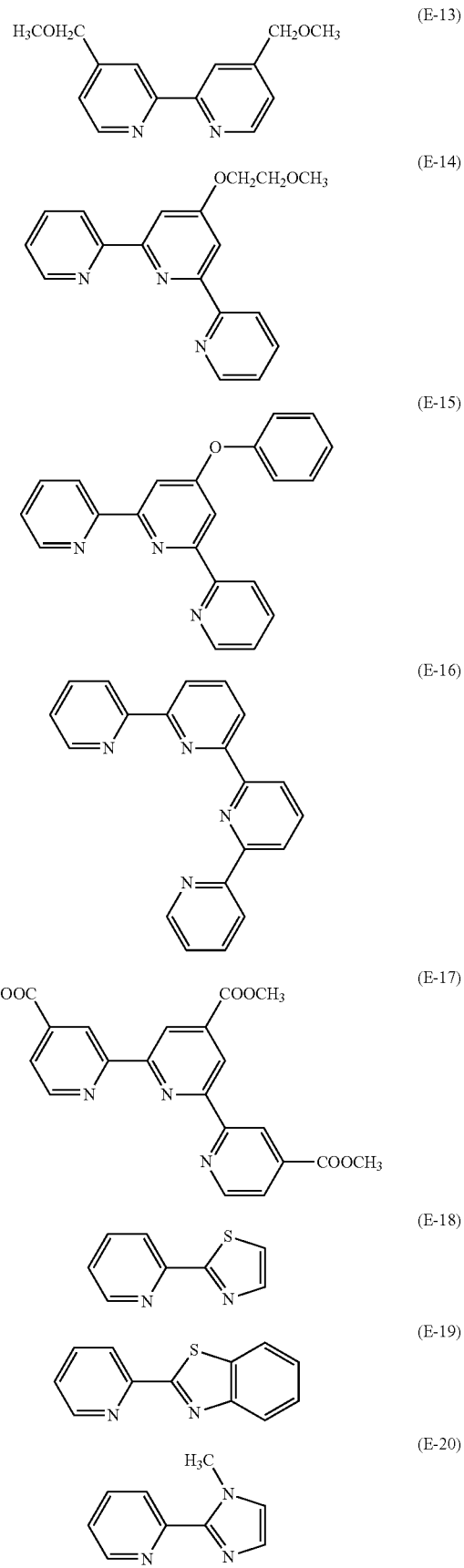
(E-13)
(E-14)
(E-15)
(E-16)
(E-17)
(E-18)
(E-19)
(E-20)

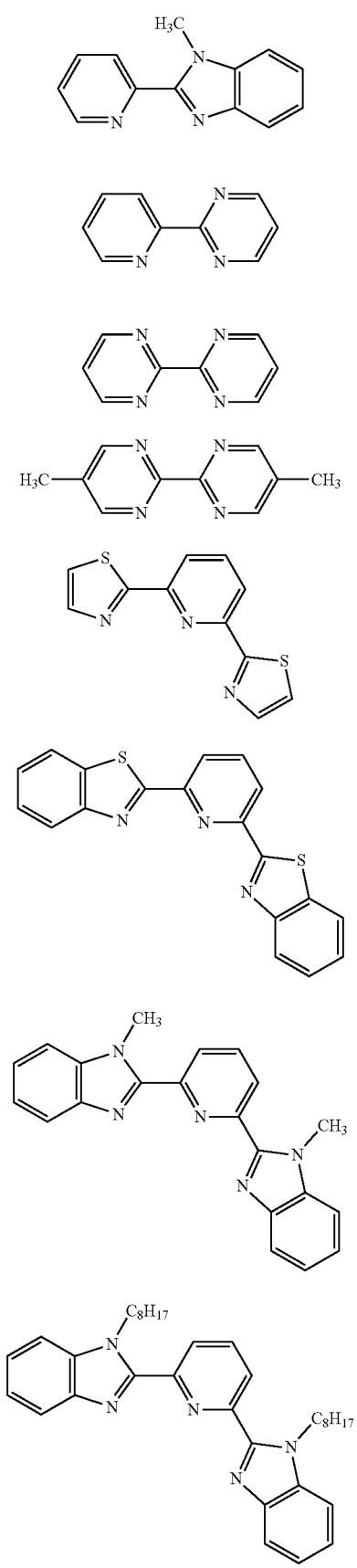

Examples of the anion include a hydride ion (H⁻), a fluoride ion (F⁻), a chloride ion (Cl⁻), a bromide ion (Br⁻), an iodide ion (I⁻), a hydroxide ion (OH⁻), a cyanide ion (CN⁻), a nitric acid ion (NO$_3^-$), a nitrous acid ion (NO$_2^-$), a hypochlorous acid ion (ClO⁻), a chlorous acid ion (ClO$_2^-$), a chloric acid ion (ClO$_3^-$), a perchloric acid ion (CO$_4^-$), a permanganic acid ion (MnO$_4^-$), an acetic acid ion (CH$_3$COO⁻), a hydrogen carbonate ion (HCO$_3^-$), a dihydrogen phosphate ion (H$_2$PO$_4^-$), a hydrogen sulfate ion (HSO$_4^-$), a hydrogen sulfide ion (HS⁻), a thiocyanic acid ion (SCN⁻), a tetrafluoroboric acid ion (BF$_4^-$), a hexafluorophosphate ion (PF$_6^-$), a tetracyanoborate ion (B(CN)$_4^-$), a dicyanoamine ion (N(CN)$_2^-$), a p-toluenesulfonic acid ion (TsO⁻), a trifluoromethyl sulfonate ion (CF$_3$SO$_2^-$), a bis(trifluoromethylsulfonyl)amine ion (N(SO$_2$CF$_3$)$^{2-}$), a tetrahydroxoaluminate ion ([Al(OH)$_4$]⁻ or [Al(OH)$_4$(H$_2$O)$_2$]⁻), a dicyanoargentate (I) ion ([Ag(CN)$_2$]⁻), a tetrahydroxochromate (III) ion ([Cr(OH)$_4$]⁻), a tetrachloroaurate (III) ion ([AuCl$_4$]⁻), an oxide ion (O$^{2-}$), a sulfide ion (S$^{2-}$), a peroxide ion (O$_2^{2-}$), a sulfuric acid ion (SO$_4^{2-}$), a sulfurous acid ion (SO$_3^{2-}$), a thiosulfuric acid (S$_2$O$_3^{2-}$), a carbonic acid ion (CO$_3^{2-}$), a chromic acid ion (CrO$_4^{2-}$), a dichromic acid ion (Cr$_2$O$_7^{2-}$), a monohydrogen phosphate ion (HPO$_4^{2-}$), a tetrahydroxozincate (II) ion ([Zn(OH)$_4$]$^{2-}$), a tetracyanozincate (II) ion ([Zn(CN)$_4$]$^{2-}$), a tetrachlorocuprate (II) ion ([CuCl$_4$]$^{2-}$), a phosphoric acid ion (PO$_4^{3-}$), a hexacyanoferrate (III) ion ([Fe(CN)$_6$]$^{3-}$), a bis(thiosulfate) argentat (I) ion ([Ag(S$_2$O$_3$)$_2$]$^{3-}$), and a hexacyanoferrate (II) ion ([Fe(CN)$_6$]$^{4-}$). Among the above-listed examples, a tetrafluoroboric acid ion, a hexafluorophosphate ion, a tetracyanoborate ion, a bis(trifluoromethylsulfonyl)amine ion, and a perchloric acid ion are preferable.

Among the above-listed metal complexes, trivalent cobalt complexes represented by Structural Formulae (4) and (5) below are particularly preferable. Use of the trivalent cobalt complex as the metal complex is advantageous because a reduction in output with light of low illuminance can be prevented before and after being exposed to light of high illuminance.

[Chem. 13]

Structural Formula (4)

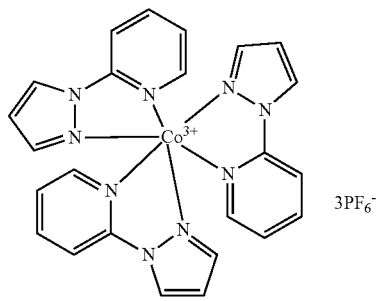

[Chem. 14]

Structural Formula (5)

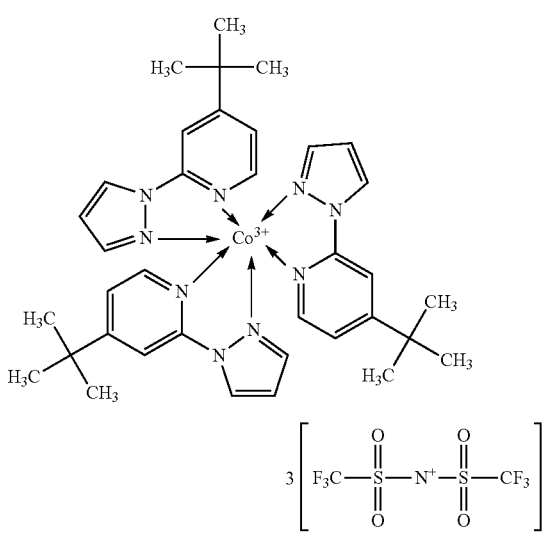

[Chem. 15]

Structural Formula (6)

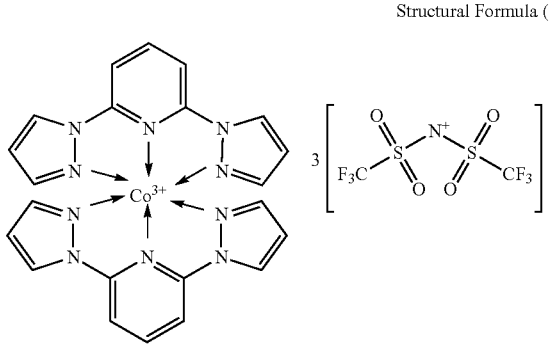

The above-listed examples may be used alone or in combination.

An amount of the oxidizing agent is preferably 0.5 parts by mass or greater but 30 parts by mass or less and more preferably 1 part by mass or greater but 15 parts by mass relative to 100 parts by mass of the hole transport material.

It is not necessary to oxidize the entire hole transport material through the addition of the oxidizing agent and the addition thereof is effective as long as at least part of the hole transport material is oxidized.

Moreover, the hole transport layer preferably further includes an alkali metal salt. The hole transport layer including the alkali metal salt can improve output and moreover the hole transport layer can improve light irradiation resistance or high temperature storage resistance.

Examples of the alkali metal salt include: lithium salts, such as lithium chloride, lithium bromide, lithium iodide, lithium perchlorate, lithium bis(trifluoromethanesulfonyl)diimide, lithium diisopropyl imide, lithium acetate, lithium tetrafluoroborate, lithium pentafluorophosphate, and lithium tetracyanoborate; sodium salts, such as sodium chloride, sodium bromide, sodium iodide, sodium perchlorate, sodium bis(trifluoromethanesulfonyl)diimide, sodium acetate, sodium tetrafluoroborate, sodium pentafluorophosphate, and sodium tetracyanoborate; and potassium salts, such as potassium chloride, potassium bromide, potassium iodide, and potassium perchlorate. Among the above-listed examples, lithium bis(trifluoromethanesulfonyl)diimide and lithium diisopropyl imide are preferable.

An amount of the alkali metal salt is preferably 1 part by mass or greater but 50 parts by mass or less, and more preferably 5 parts by mass or greater but 30 parts by mass or less, relative to 100 parts by mass of the hole transport material.

The hole transport layer may have a single layer structure formed of a single material, or a laminate structure including a plurality of compounds. In the case where the hole transport layer has a laminate structure, a polymer material is preferably used for a layer of the hole transport layer disposed near the second electrode. Use of the polymer material having excellent film formability is advantageous because a surface of the porous electron transport layer can be made smoother and photoelectric conversion properties can be improved. Since the polymer material does not easily permeate the porous electron transport layer, moreover, a surface of the porous electron transport layer is desirably covered and an effect of preventing short circuits at the time when an electrode is disposed may be obtained.

Examples of the polymer material for use in the hole transport layer include hole transport polymer materials known in the art.

Examples of the hole transport polymer material include a polythiophene compound, polyphenylene vinylene compound, a polyfluorene compound, a polyfluorene compound, polyphenylene compound, a polyaryl amine compound, and a polythiadiazole compound.

Examples of the polythiophene compound include poly (3-n-hexylthiophene),
poly(3-n-octyloxythiophene), poly(9,9'-dioctyl-fluorene-co-bithiophene),
poly(3,3"-didodecyl-quaterthiophene), poly(3,6-dioctylthieno[3,2-b]thiophene),
poly(2,5-bis(3-decylthiophen-2-yl)thieno[3,2-b]thiophene),
poly(3,4-didecylthiophene-co-thieno[3,2-b]thiophene),
poly(3,6-dioctylthieno[3,2-b]thiophene-co-thieno[3,2-b]thiophene),
poly(3,6-dioctylthieno[3,2-b]thiophene-co-thiophene), and
poly(3,6-dioctylthieno[3,2-b]thiophene-co-bithiophene).

Examples of the polyphenylene vinylene compound include
poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylhexyloxy)-1,4-phenylenevinylene)-co-(4,4'-biphenylene-vinylene)].

Examples of the polyfluorene compound include poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4phenylene)], and poly[(9,9-dioctyl-2,7-diyl)-co-(1,4-(2,5-dihexyloxy)benzene)].

Examples of the polyphenylene compound include poly[2,5-dioctyloxy-1,4-phenylene] and poly[2,5-di(2-ethylhexyloxy-1,4-phenylene].

Examples of the polyaryl amine compound include poly[(9,9-dioctylfluorenyl-2,7-diyl)-alt-co-(N,N'-diphenyl)-N,N'-di(p-hexylphenyl)-1, 4-diaminobenzene], poly[(9,9-dioctylfluorenyl-2,7-diyl)-alt-co-(N,N'-bis(4-octyloxyphenyl)benzidine-N,N'-(1,4-diphenylene)], poly [N,N'-bis(4-octyloxyphenyl)benzidine-N,N'-(1,4-diphenylene)], poly [N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolyimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene].

Examples of the polythiadiazole compound include poly[(9,9-dioctylfluorenyl-2,7-diyl)-alt-co-(1,4-benzo(2,1',3)thiadiazole], and poly(3,4-didecylthiophene-co-(1,4-benzo(2,1',3)thiadiazole).

Among the above-listed examples, a polythiophene compound and a polyaryl amine compound are preferable in view of carrier mobility and ionization potential.

An average thickness of the hole transport layer is not particularly limited and may be appropriately selected depending on the intended purpose. The hole transport layer preferably has a structure where the hole transport layer penetrates pores of the porous electron transport layer. The average thickness of the hole transport layer on the electron transport layer is preferably 0.01 micrometers or greater but 20 micrometers or less, more preferably 0.1 micrometers or greater but 10 micrometers or less, and even more preferably 0.2 micrometers or greater but 2 micrometers or less.

The hole transport layer can be directly formed on the electron transport layer to which the photosensitizing compound is adsorbed. A production method of the hole transport layer is not particularly limited and may be appropriately selected depending on the intended purpose. Examples of the production method thereof include a method where a thin film is formed in vacuum, such as vapor deposition, and a wet film forming method. Among the above-listed examples, a wet film forming method is particularly preferable in view of a production cost. A method where the hole transport layer is applied onto the electron transport layer is preferable.

In case of the wet film forming method, a coating method is not particularly limited and is performed according to any of methods known in the art. Examples of the coating method include dip coating, spray coating, wire bar coating, spin coating, roller coating, blade coating, and gravure coating. As a wet printing method, various methods, such as relief printing, offset printing, gravure printing, intaglio printing, rubber plate printing, and screen printing, can be used.

Moreover, a film may be formed in a supercritical fluid or subcritical fluid having the lower temperature and pressure than critical points. The supercritical fluid is not particularly limited and may be appropriately selected depending on the intended purpose, as long as the supercritical fluid is a fluid that exists as a non-condensable high-pressure fluid in the temperature and pressure region exceeding the limits (critical points) where a gas and a liquid can coexist and is not condensed as being compressed, and is a fluid in the state equal to or higher the critical temperature and equal to or higher than the critical pressure. The supercritical fluid is preferably a supercritical fluid having a low critical temperature.

Examples of the supercritical fluid include carbon monoxide, carbon dioxide, ammonia, nitrogen, water, an alcohol solvent, a hydrocarbon solvent, a halogen solvent, and an ether solvent.

Examples of the alcohol solvent include methanol, ethanol, and n-butanol.

Examples of the hydrocarbon solvent include ethane, propane, 2,3-dimethylbutane, benzene, and toluene. Examples of the halogen solvent include methylene chloride and chlorotrifluoromethane.

Examples of the ether solvent include dimethyl ether.

The above-listed examples may be used alone or in combination.

Among the above-listed examples, carbon dioxide is preferable because carbon dioxide has critical pressure of 7.3 MPa and a critical temperature of 31 degrees Celsius, and therefore a supercritical state of carbon dioxide is easily formed and carbon dioxide is inflammable and easily handled.

The subcritical fluid is not particularly limited and may be appropriately selected depending on the intended purpose, as long as the subcritical fluid is a fluid that exists as a high-pressure liquid in the temperature and pressure region near the critical points. The compounds listed as the supercritical compound can be also suitably used as the subcritical fluid.

The critical temperature and critical pressure of the supercritical fluid are is not particularly limited and may be appropriately selected depending on the intended purpose. The critical temperature is preferably −273 degrees Celsius or higher but 300 degrees Celsius or lower, and more preferably 0 degrees Celsius or higher but 200 degrees Celsius or lower.

In addition to the supercritical fluid or subcritical fluid, moreover, an organic solvent or an entrainer may be used in combination. A solubility in the supercritical fluid can be easily performed by adding the organic solvent or the entrainer.

The organic solvent is not particularly limited and may be appropriately selected depending on the intended purpose. Examples of the organic solvent include a ketone solvent, an ester solvent, an ether solvent, an amide solvent, a halogenated hydrocarbon solvent, and a hydrocarbon solvent.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diisopropyl ether, dimethoxy ethane, tetrahydrofuran, dioxolane, and dioxane.

Examples of the amide solvent include N,N-dimethylformamide, N,N-dimethylacetoamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

The above-listed examples may be used alone or in combination.

After laminating the hole transport material on the electron transport layer to which the photosensitizing compound is adsorbed, moreover, pressing may be performed. Since the hole transport material is more closely attached to the electron transport layer that is a porous electrode by performing the pressing, efficiency may be improved.

A method of the pressing is not particularly limited and may be appropriately selected depending on the intended purpose. Examples of the method thereof include press molding using a plate, such as IR pellet press, and roll pressing using a roller.

The pressure is preferably 10 kgf/cm$^2$ or greater, and more preferably 30 kgf/cm$^2$ or greater.

The duration of the pressing is not particularly limited and may be appropriately selected depending on the intended purpose. The duration is preferably 1 hour or shorter. Moreover, heat may be applied at the time of the pressing. At the time of the pressing, a release agent may be disposed between a press and the electrode.

Examples of the release agent include fluororesins, such as polyethylene tetrafluoride, polychloro ethylene trifluoride, an ethylene tetrafluoride-propylene hexafluoride copolymer, a perfluoroalkoxy fluorocarbon resin, polyvinylidene fluoride, an ethylene-ethylene tetrafluoride copolymer, an ethylene-chloroethylene trifluoride copolymer, and polyvinyl fluoride. The above-listed examples may be used alone or in combination.

After performing the pressing but before disposing a second electrode, metal oxide may be disposed between the hole transport material and the second electrode.

Examples of the metal oxide include molybdenum oxide, tungsten oxide, vanadium oxide, and nickel oxide. The above-listed examples may be used alone or in combination. Among the above-listed examples, molybdenum oxide is preferable.

A method for disposing the metal oxide on the hole transport layer is not particularly limited and may be appropriately selected depending on the intended purpose. Examples of the method include a method where a thin film is formed in vacuum, such as sputtering and vacuum vapor deposition, and a wet film forming method.

As the wet film forming method, a method where a paste in which powder or sol of metal oxide is dispersed is prepared and the paste is applied onto the hole transport layer is preferable. In the case where the wet film forming method is used, a coating method is not particularly limited and may be performed according to any of methods known in the art. Examples of the coating method include dip coating, spray coating, wire bar coating, spin coating, roller coating, blade coating, and gravure coating. As a wet printing method, moreover, various methods, such as relief printing, offset printing, gravure printing, intaglio printing, rubber plate printing, and screen printing, can be used.

An average thickness of the applied metal oxide is preferably 0.1 nm or greater but 50 nm or less, and more preferably 1 nm or greater but 10 nm or less.

Second Electrode

The second electrode may be formed on the hole transport layer or the metal oxide of the hole transport layer. As the second electrode, moreover, an electrode identical to the first electrode may be used. In the case where the strength of the second electrode can be sufficiently secured, a support is not necessarily required.

Examples of a material of the second electrode include metal, a carbon compound, conductive metal oxide, and a conductive polymer.

Examples of the metal include platinum, gold, silver, copper, and aluminium.

Examples of the carbon compound include graphite, fullerene, carbon nanotubes, and graphene.

Examples of the conductive metal oxide include ITO, FTO, and ATO.

Examples of the conductive polymer include polythiophene and polyaniline.

The above-listed examples may be used alone or in combination.

The second electrode can be formed on the hole transport layer by an appropriate method, such as coating, laminating, vapor deposition, CVD, and bonding, depending on a material of the second electrode for use, or the hole transport layer for use.

Within the photoelectric conversion element, at least one of the first electrode and the second electrode is preferably substantially transparent. It is preferable that the side of the first electrode be transparent and incident light enter the photoelectric conversion element from the side of the first electrode. In this case, a material that reflects light is preferably used at the side of the second electrode. As the material that reflects light, glass or a plastic to which metal or conductive oxide is deposited through vapor deposition, or a metal thin film is preferably used. Moreover, it is also effective to dispose an anti-reflection layer at the side from which incident light enters.

Second Substrate

The second substrate is not particularly limited and may be selected from substrates known in the art. Examples of the second substrate include substrates of glass, plastic films, and ceramics. A convex-concave part may be formed at a contact area of the second substrate with a sealing member in order to increase adhesion between the second substrate and the sealing member.

A formation method of the convex-concave part is not particularly limited and may be appropriately selected depending on the intended purpose. Examples of the formation method include sand blasting, water blasting, polishing with sand paper, chemical etching, and laser processing.

As a method for increasing adhesion between the second substrate and the sealing member, for example, organic matter on a surface thereof may be removed or hydrophilicity of the surface thereof may be improved. A method for removing organic matter on a surface of the second substrate is not particularly limited and may be appropriately selected depending on the intended purpose. Examples of the method include UV ozone washing and an oxygen plasma treatment.

<<Sealing Member>>

Examples of a sealing resin include an acrylic resin and an epoxy resin.

As a cured product of the acrylic resin, any of materials known in the art can be used as long as the cured product of the acrylic resin is a product obtained by curing a monomer or oligomer including an acryl group in a molecule thereof.

As a cured product of the epoxy resin, any of materials known in the art can be used as long as the cured product of the epoxy resin is a product obtained by curing a monomer or oligomer including an epoxy group in a molecule thereof.

Examples of the epoxy resin include a water-dispersing epoxy resin, a non-solvent epoxy resin, a solid epoxy resin, a heat-curable epoxy resin, a curing agent-mixed epoxy resin, and an ultraviolet ray-curable epoxy resin. Among the above-listed examples, a heat-curable epoxy resin and an ultraviolet ray-curable epoxy resin are preferable, and an ultraviolet ray-curable epoxy resin is more preferable. Note that, heating may be performed even on an ultraviolet ray-curable resin, and heating is preferably performed even after curing the epoxy resin with ultraviolet ray irradiation.

Examples of the epoxy resin include a bisphenol A-based epoxy resin, a bisphenol F-based epoxy resin, a novolac-based epoxy resin, a alicyclic epoxy resin, a long-chain aliphatic epoxy resin, a glycidyl amine-based epoxy resin, a glycidyl ether-based epoxy resin, and a glycidyl ester-based epoxy resin. The above-listed examples may be used alone or in combination.

A curing agent or various additives are preferably mixed with the epoxy resin according to the necessity.

The curing agent is classified into an amine-based curing agent, an acid anhydride-based curing agent, a polyamine-based curing agent, and other curing agents. The curing agent is appropriately selected depending on the intended purpose.

Examples of the amine-based curing agent include: aliphatic polyamine, such as diethylenetriamine and triethylenetetramine; and aromatic polyamine, such as methphenylenediamine, diaminodiphenylmethane, and diaminodiphenylsulfone.

Examples of the acid anhydride-based curing agent include phthalic anhydride, tetra or hexahydrophthalic anhydride, methyltetrahydrophthalic anhydride, methylnadic anhydride, pyromellitic anhydride, HET anhydride, and dodecenylsuccinic anhydride.

Examples of other curing agents include imidazoles and polymercaptan. The above-listed examples may be used alone or in combination.

Examples of the additives include fillers, a gap agent, a polymerization initiator, a desiccant (dehumidifying agent), a curing accelerator, a coupling agent, a flexibilizer, a colorant, a flame retardant auxiliary, an antioxidizing agent, and an organic solvent. Among the above-listed examples, fillers, a gap agent, a curing accelerator, a polymerization initiator, and a desiccant (dehumidifying agent) are preferable, and fillers and a polymerization initiator are more preferable.

As well as that the fillers are effective for suppressing entry of moisture or oxygen, the fillers can impart an effect of reducing an amount of outgas at the time of curing or heating, improving mechanical strength, and controlling heat transmittance or fluidity, and the fillers are very effective for maintaining stable output in various environments. Particularly, output properties or durability of a photoelectric conversion element is not only influenced simply by moisture or oxygen entered, but also an influence of outgas generated at the time of curing or heating the sealing member cannot be ignored. Especially, outgas generated at the time of heating greatly affects output properties of a photoelectric conversion element stored in a high temperature environment.

In this case, entry of moisture or oxygen can be suppressed by adding fillers, a gap agent, or a disccant into the sealing member, and therefore an amount of the sealing member for use can be reduced to thereby obtain an effect of reducing outgas. Use of such additives is effective not only at the time of curing but also when a photoelectric conversion element is stored in a high temperature environment.

The fillers are not particularly limited and any of fillers known in the art can be used as the fillers. For example, inorganic fillers, such as crystalline or irregular silica, talc, alumina, aluminium nitrate, calcium silicate, and calcium carbonate, are preferably used. The above-listed examples may be used alone or in combination. An average primary particle diameter of the fillers is preferably 0.1 micrometers or greater but 10 micrometers or less, and more preferably 1 micrometer or greater but 5 micrometers or less. When the average primary particle diameter is within the above-mentioned preferable range, an effect of suppressing entry of moisture or oxygen can be sufficiently obtained, an appropriate viscosity is obtained, adhesion with a substrate or defoaming is improved, and it is effective for controlling a width of a sealing part or workability.

An amount of the fillers is preferably 10 parts by mass or greater but 90 parts by mass or less, and more preferably 20 parts by mass or greater but 70 parts by mass or less, relative to 100 parts by mass of the entire sealing member. When the amount of the fillers is within the above-mentioned range, an effect of suppressing entry of moisture or oxygen can be sufficiently obtained, an appropriate viscosity is obtained, and excellent adhesion and workability can be obtained.

The gap agent is also called a gap controlling agent or a spacing agent, and is configured to control a gap of the sealing part. When a sealing member is applied onto a first substrate of a first electrode and a second substrate is placed thereon to seal, for example, a gap of a sealing part is matched with a size of a gap agent because the gap agent is mixed with the epoxy resin, and therefore the gap of the sealing part can be easily controlled.

As the gap agent, any of materials known in the art can be used as long as the gap agent is a particulate material having a uniform particle size and having high solvent resistance and heat resistance. The gap agent is preferably a material which has high affinity to an epoxy resin and is in the shape of particles that are spheres. Specific examples of the gap agent include glass beads, silica particles, and organic resin particles. The above-listed examples may be used alone or in combination.

A particle size of the gap agent can be selected depending on a gap of a sealing part to be set. The particle size thereof is preferably 1 micrometer or greater but 100 micrometers or less, and more preferably 5 micrometers or greater but 50 micrometers or less.

The polymerization initiator is a material that is added for the purpose of initiating polymerization using heat or light.

The thermal polymerization initiator is a compound that generates an active species, such as radicals and cations, upon heating. As the thermal polymerization initiator, specifically, an azo compound, such as 2,2'-azobisbutyronitrile (AIBN), or peroxide, such as benzoyl peroxide (BPO) is used. As the thermal cationic polymerization initiator, benzenesulfonic acid ester, or alkyl sulfonium salt is used. As the photopolymerization initiator, a photo cationic polymerization initiator is preferably used for the epoxy resin. When the photo cationic polymerization initiator is mixed with the epoxy resin and light irradiation is performed, the photo cationic polymerization initiator is decomposed to generate strong acid, and the acid induces polymerization of the epoxy resin to proceed a curing reaction. The photo cationic polymerization initiator has effects that a volume contraction during curing is small, oxygen inhibition does not occur, and storage stability is high.

Examples of the photo cationic polymerization initiator include an aromatic diazonium salt, an aromatic iodonium salt, an aromatic sulfonium salt, a metallocene compound, and a silanol-aluminium complex.

Moreover, a photoacid generator having a function of generating acid upon irradiation of light can be also used. The photoacid generator functions as an acid for initiating cationic polymerization. Examples of the photoacid generator include onium salts, such as an ionic sulfonium salt-based photoacid generator made up of a cation part and an anionic part and an ionic part, and an ionic iodonium salt made up of a cation part and an anionic part. The above-listed examples may be used alone or in combination.

An amount of the polymerization initiator added may vary depending on a material for use. The amount of the polymerization initiator is preferably 0.5 parts by mass or greater but 10 parts by mass, more preferably 1 part by mass or greater but 5 parts by mass or less, relative to 100 parts by mass of the entire sealing member. The polymerization initiator added in the amount of the above-mentioned range is effective because curing is appropriately progressed, an amount of uncured resides can be reduced, and excessive outgassing can be prevented.

The desiccant is also called a dehumidifying agent and is a material having a function of physically or chemically adsorbing or absorbing moisture. There is a case where humidity resistance is further enhanced or an influence of outgassing may be reduced by adding the desiccant to the sealing member. Therefore, use of the desiccant is effective.

The desiccant is preferably a particulate material. Examples of the desiccant include inorganic water-absorbing materials, such as calcium oxide, barium oxide, magnesium oxide, magnesium sulfate, sodium sulfate, calcium chloride, silica gel, molecular sieve, and zeolite. Among the above-listed examples, zeolite is preferable because zeolite has a large amount of moisture absorption. The above-listed examples may be used alone or in combination.

The curing accelerator is also called a curing catalyst and is used for the purpose of accelerating curing speed. The curing accelerator is mainly used for a heat curable epoxy resin.

Examples of the curing accelerator include: tertiary amine or tertiary amine salts, such as 1,8-diazabicyclo(5,4,0)-undec-7-ene (DBU) and 1,5-bicyclo(4,3,0)-non-5-ene (DBN); imidazole-based curing accelerators, such as 1-cyanoethyl-2-ethyl-4-methylimidazole and 2-ethyl-4-methylimidazole; and phofine or phosphonium salts, such as triphenylphosphine and tetraphenylphosphonium tetraphenylborate. The above-listed examples may be used alone or in combination.

The coupling agent has an effect of increasing molecular binding force. Examples of the coupling agent include a silane coupling agent. Examples of the coupling agent include: silane coupling agents, such as 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-gamma-aminopropyltrimethoxysilane, N-(2-aminoethyl)3-aminopropylmethyldimethoxysilane, N-(2-aminoethyl)3-aminopropylmethyltrimethoxysilane, 3-aminopropyltriethoxysilane, 3-mercaptopropyltrimethoxysilane, vinyltrimethoxysilane, N-(2-(vinylbenzylamino)ethyl)3-aminopropyltrimethoxysilane hydrochloride, and 3-methacryloxypropyltrimethoxysilane. The above-listed examples may be used alone or in combination.

As the sealing member, moreover, an epoxy resin composition that is commercially available as an encapsulant, a sealing material, or an adhesive has been known, and such commercial products can be used in the present disclosure. Among such commercial products, there are epoxy resin compositions that are developed and commercially available for use in solar cells or organic EL elements, and such commercial products are particularly effectively used in the present disclosure. Examples thereof include: TB3118, TB3114, TB3124, and TB3125F (available from Three-Bond); WorldRock5910, WorldRock5920, and WorldRock8723 (available from Kyoritsu Chemical Co., Ltd.); and WB90US(P) (available from MORESCO Corporation).

In the present disclosure, a sealing sheet material may be used.

The sealing sheet material is a material where an epoxy resin layer has been formed on a sheet in advance. As the sheet, glass or a film having high gas barrier properties is used. The sheet corresponds to the second substrate of the present disclosure. A sealing member and a second substrate can be formed at once by bonding the sealing sheet material onto the substrate, followed by curing. Use of the sealing sheet material is effective because a structure having a void part can be formed by a formation pattern of the epoxy resin layer formed on the sheet.

A formation method of the sealing member is not particularly limited and the sealing member can be formed according to any of methods known in the art. For example, any of various methods, such as dispensing, wire bar coating, spin coating, roller coating, blade coating, gravure coating, relief printing, offset printing, intaglio printing, rubber plate printing, and screen printing, can be used.

Moreover, a passivation layer may be disposed between the sealing member and the second electrode. The passivation layer is not particularly limited and may be appropriately selected depending on the intended purpose, as long as the passivation layer is disposed in a manner that the sealing member is not to be in contact with the second electrode. As the passivation layer, aluminium oxide, silicon nitride, or silicon oxide is preferably used.

Embodiments for carrying out the present disclosure will be described with reference to drawings. In the drawings, the identical numerical sign is given to the identical structural part, and duplication of descriptions may be avoided by omitting.

<Structure of Element>

FIG. 1 is a schematic view illustrating one example of the photoelectric conversion element of the present disclosure. As illustrated in FIG. 1, the photoelectric conversion element 101 includes a first electrode 2 formed on a first substrate 1. An electron transport layer 4 is formed on the first electrode 2 and a photosensitizing compound 5 is adsorbed on a surface of an electron transport material constituting the electron transport layer 4. At the upper part and inner part of the electron transport layer 4, a hole transport layer 6 is formed. A second electrode 7 is formed on the hole transport layer 6. At the upper side of the second electrode 7, a second substrate 9 is disposed. The second substrate 9 is fixed with the first electrode 2 via a sealing member 8. The photoelectric conversion element illustrated in FIG. 1 has a void part between the second electrode 7 and the second substrate 9. Since the void part is arranged, a moisture content or oxygen concentration inside the void part can be controlled and power generation capability or durability can be improved. Since the second electrode 7 and the second substrate 9 are not directly in contact with each other, moreover, peeling or breakage of the second electrode 7 can be prevented. The oxygen concentration inside the void part is not particularly limited and may be freely selected. The oxygen concentration is preferably 0 percent or greater but 21 percent or less, more preferably 0.05 percent or greater but 10 percent or less, and even more preferably 0.1 percent or greater but 5 percent or less.

Although it is not illustrated, each of the first electrode 2 and the second electrode 7 has a path for conducting from each electrode to each electrode output terminal.

FIG. 2 is a schematic view illustrating another example of the photoelectric conversion element of the present disclosure. A hole blocking layer 3 is formed between the first substrate 1 and the electron transport layer 4. The formation of the hole blocking layer 3 can prevent recombination of electrons and holes and is effective for improving powder generation capability. Similarly to FIG. 1, the photoelectric conversion element illustrated in FIG. 2 has a void part between the second electrode 7 and the second substrate 9.

FIG. 3 is a schematic view illustrating another example of the photoelectric conversion element of the present disclosure, and illustrates an example where the void part of FIG. 2 is covered with the sealing member 8. For example, the photoelectric conversion element can be formed by a method where the sealing member 8 is applied onto an entire surface of the second electrode 7 and the second substrate 9 is disposed thereon, or a method using the above-described sealing sheet material. In this case, a void part inside the sealing may be completely removed, or the void part may be partially left. By covering the substantially entire surface of the second electrode with the sealing member as described, peeling or breakage of the second substrate 9 can be reduced, and mechanical strength of the photoelectric conversion element can be enhanced.

FIG. 4 is a schematic view illustrating another example of the photoelectric conversion element of the present disclosure and illustrates that the sealing member 8 is bonded to the first substrate 1 and the second substrate 9. Since the photoelectric conversion element has the above-described structure, adhesion between the sealing member 8 and the substrate is strong, and therefore an effect of enhancing mechanical strength of the photoelectric conversion element can be obtained. Since close bonding between the sealing member and the substrate is enhanced, moreover, an effect of enhancing a sealing effect for preventing entry of moisture or oxygen can be obtained.

FIG. 5 is a schematic view illustrating one example of a solar cell module of the present disclosure and illustrates one example of the solar cell module where a plurality of photoelectric conversion elements are included and the photoelectric conversion elements are connected in series. In the example of FIG. 5, a through part 10 is formed after forming the hole transport layer 6, and then the second electrode 7 is formed to thereby introduce the second electrode material inside the through part 10 and conduct the first electrodes 2b of the adjacent cells. Although they are not illustrated in FIG. 5, each of the first electrode 2a and the second electrode 7b has a path for conducting from each electrode to an electrode of the adjacent cell or an output terminal.

In FIG. 5, among at least two photoelectric conversion elements adjacent to each other in the solar cell module 102, the hole transport layers 6 are linked together without linking the hole blocking layers 3 together. As a result, the solar cell module 102 hardly generates leak electric current with light of high illuminance and the photo-sensitizing compound is not easily damaged, and therefore a reduction in output with light of low illuminance before or after being exposed to light of high illuminance can be suppressed. Therefore, the solar cell module 102 can has high power output with light emitted from illumination devices used indoors, such as LED and a fluorescent lamp even after being exposed to sun light.

Note that, the through part 10 may pierce through the first electrode 2 to reach the first substrate 1. Alternatively, processing may be stopped at the time when the through part 10 reaches inside the first electrode 2 and the through part 10 may not reach the first substrate 1. In the case where a shape of the through part 10 is a pore that penetrates through the first electrode 2 to reach the first substrate 1, if a total opening area of pores is excessively large relative to an area of the through part 10, a resistance value increases as a cross-sectional film area of the first electrode 2 decreases, and therefore a photoelectric conversion efficiency may decrease. Therefore, a ratio of the total opening area of the pores to the area of the through part 10 is preferably from 5/100 through 60/100.

Moreover, examples of a formation method of the through part 10 include sand blasting, water blasting, polishing with sand paper, chemical etching, and laser processing. In the present disclosure, laser processing is preferable because a fine pore can be formed without using sand, etching, or a resist and processing can be performed cleanly and with good reproducibility. Another reason why laser processing is preferable is that at least one of the hole blocking layer 3, the electron transport layer 4, the hole transport layer 6, and the second electrode 7, or all on the above-listed layers in some cases can be removed by impact peeling through laser processing at the time when the through part 10 is formed. As a result, it is not necessary to dispose a mask at the time of laminating, and removal and formation of the fine through part 10 can be easily and simply performed at once.

FIG. 6 is a schematic view illustrating one example of the solar cell module of the present disclosure. Unlike FIG. 5, the electron transport layer 4 is cut out from the adjacent photoelectric conversion element and each photoelectric conversion element has an independent layer structure. As a result, electric current leakage is reduced by suppressing electron diffusion as the electron transport layers 4 are not extended to each other in the solar cell module 102 illustrated in FIG. 6, and therefore light resistance is improved.

FIG. 7 is a schematic view illustrating one example of the solar cell module of the present disclosure and illustrates an example where the solar cell module includes a plurality of photoelectric conversion elements that are connected in series, and sealing members are disposed in a void part between the cell like beams. When a void part is disposed between the second electrode 7 and the second substrate 9 as in FIG. 2, peeling or breakage of the second electrode 7 can be prevented but mechanical strength of sealing may decrease. When the gap between the second electrode 7 and the second substrate 9 is filled with the sealing member as in FIG. 3, on the other hand, mechanical strength of sealing increases, but peeling of the second electrode 7 may occur. In order to increase power generation, to increase an area of a solar cell module is effective but a reduction in mechanical strength cannot be avoided when the solar cell module has a void part. In this case, peeling or breakage of the second substrate 9 can be prevented and mechanical strength of sealing can be enhanced by disposing sealing members like beams as illustrated in FIG. 7.

The solar cell module of the present disclosure can be applied for a power source device by using a combination with a circuit board configured to control generated electric current. Examples of devices that can use such a power source device include an electronic calculator and a watch. In addition, a power source device including the photoelectric conversion element of the present disclosure can be applied for a mobile phone, an electronic organizer, and electronic paper. Moreover, a power source device including the photoelectric conversion element of the present disclosure can be used as an auxiliary power source for extending a period of a continuous use of a rechargeable or dry-battery-loaded electric appliance.

EXAMPLES

The present disclosure will be described more specifically below by way of Examples. The present disclosure should not be construed as being limited to these Examples.

Example 1

<Production of Solar Cell Module>

A film of indium-doped tin (ITO) and a film of niobium-doped tin oxide (NTO) serving as a first electrode were sequentially deposited on a glass substrate serving as a first substrate by sputtering. Subsequently, a dense layer formed of titanium oxide serving as a hole blocking layer was formed by reactive sputtering. Subsequently, etching was performed on part of the ITO/NTO and hole blocking layer formed on the substrate by laser processing to thereby make a space between adjacent photoelectric conversion elements to be 10 micrometers.

Subsequently, a bead mill treatment was performed for 12 hours on 3 g of titanium oxide (ST-21, available from ISHIHARA SANGYO KAISHA, LTD.), 0.2 g of acetyl acetone, and 0.3 g of a surfactant (polyoxyethylene octylphenyl ether, available from Wako Pure Chemical Corporation) together with 5.5 g of water and 1.0 g of ethanol to obtain a titanium oxide dispersion liquid. To the obtained titanium oxide dispersion liquid, 1.2 g of polyethylene glycol (#20,000, available from Wako Pure Chemical Corporation) was added to produce a paste. The obtained paste was applied onto the hole blocking layer in a manner that an average thickness was to be about 1.5 micrometers. After drying the applied paste at 60 degrees Celsius, firing was performed in air for 30 minutes at 550 degrees Celsius, to thereby form a porous electron transport layer.

The glass substrate to which the electron transport layer had been formed was dipped in a solution obtained by adding an acetonitrile/t-butanol (volume ratio: 1/1) to 120 mg of a photosensitizing compound represented by B-5 and 150 mg of chenodeoxycholic acid (available from Tokyo Chemical Industry Co., Ltd.) and was left to stand in the dark for 1 hour to thereby make the photosensitizing compound adsorbed on a surface of the electron transport layer.

Subsequently, 15.0 mg of lithium bis(trifluoromethanesulfonyl)imide (available from KANTO CHEMICAL CO., LTD.) and 40 mg of a basic compound represented by C-12 were added and dissolved in 1 mL of a chrolobenzene solution including 183 mg of a hole transport material represented by D-7 (available from Merck KGaA), to thereby prepare a hole transport layer coating liquid.

Next, the hole transport layer coating liquid was applied onto the electron transport layer onto which the photosensitizing compound was adsorbed by spin coating, to thereby form a hole transport layer having a thickness of about 500 nm. Thereafter, the edge of the glass substrate on which a sealing member was to be disposed was etched by laser processing and a through hole for connecting elements in series was formed by laser processing. Moreover, silver was deposited thereon by vacuum vapor deposition to thereby form a second electrode having a thickness of about 100 nm. The mask film was formed to make a distance between adjacent photoelectric conversion elements 200 micrometers. Moreover, it was confirmed that the silver was deposited on the inner wall of the through hole by vapor deposition and the adjacent elements were connected in series. The number of the elements connected in series was 6.

An ultraviolet ray curable resin (TB3118, available from ThreeBond Holdings Co., Ltd.) was applied by a dispenser (2300N, available from SAN-EI TECH Ltd.) in a manner that the edge of the glass substrate was surrounded with a power generation region. Thereafter, the resultant was moved into a glove box an inner environment of which was controlled low and the oxygen concentration was controlled to 0.5 percent. Cover glass serving as a second substrate was placed on the ultraviolet ray curable resin and the ultraviolet ray curable resin was cured by irradiation of ultraviolet rays to seal the power generation region, to thereby produce Solar Cell Module 1 of the present disclosure illustrated in FIG. 5.

<Evaluation of Solar Cell Module>

IV properties of Solar Cell Module 1 obtained were evaluated under emission of white LED controlled to 3,000 lux by means of a solar cell evaluation system (As-510-PV03, available from NF Corporation), to thereby determine initial open-circuit voltage Voc1 (V) and the maximum output power Pmax1 (microW/cm$^2$). Similarly, IV properties with 100 lux were evaluated to thereby determine Voc2 and Pmax2. Subsequently, Solar Cell Module 1 was irradiated for 200 hours by means of a solar simulator (AM1.5, 10 mW/cm$^2$) to again evaluate IV properties with 3,000 lux and 100 lux to measure open-circuit voltage and the maximum output power after irradiation of light of high illuminance, to thereby determine each retention rate. The results are presented in Table 2.

Example 2

Voc1, Pmax1, Voc2, Pmax2, and retention rates were obtained in the same manner as in Example 1, except that the distance between the first electrodes and between the hole blocking layers of the adjacent photoelectric conversion elements was changed to 200 micrometers. The structure of the module is presented in Table 1. The results are presented in Table 2.

Example 3

Voc1, Pmax1, Voc2, Pmax2, and retention rates were obtained in the same manner as in Example 1, except that the distance between the electron transport layers of the adjacent photoelectric conversion elements was changed to 10 micrometers. The structure of the module is presented in Table 1. The results are presented in Table 2.

TABLE 1

| | first electrode layer | hole blocking layer | electron transport layer | hole transport layer | second electrode layer |
|---|---|---|---|---|---|
| | Distance between identical layers in adjacent photoelectric conversion elements | | | | |
| Ex. 1 | 10 μm | 10 μm | linked | linked | 200 μm |
| Ex. 2 | 200 μm | 200 μm | linked | linked | 200 μm |
| Ex. 3 | 10 μm | 10 μm | 10 μm | linked | 200 μm |
| Comp. Ex. 1 | 10 μm | linked | linked | linked | 200 μm |
| Comp. Ex. 2 | 10 μm | linked | 10 μm | 10 μm | 200 μm |
| Comp. Ex. 3 | 10 μm | 10 μm | 10 μm | 10 μm | 200 μm |
| Comp. Ex. 4 | 200 μm | 200 μm | 10 μm | 10 μm | 200 μm |

Example 4

Voc1, Pmax1, Voc2, Pmax2, and retention rates were obtained in the same manner as in Example 3, except that 8 mg of a cobalt complex compound represented by Structural Formula 4 (FK102, available from Sigma-Aldrich) was added to the hole transport material. The results are presented in Table 2.

Example 5

Voc1, Pmax1, Voc2, Pmax2, and retention rates were obtained in the same manner as in Example 3, except that 15 mg of a cobalt complex compound represented by Structural Formula 5 (FK209, available from Sigma-Aldrich) was added to the hole transport material. The results are presented in Table 2.

Example 6

Voc1, Pmax1, Voc2, Pmax2, and retention rates were obtained in the same manner as in Example 3, except that 13 mg of a cobalt complex compound represented by Structural Formula 6 (FK269, available from Sigma-Aldrich) was added to the hole transport material. The results are presented in Table 2.

Comparative Example 1

Voc1, Pmax1, Voc2, Pmax2, and retention rates were obtained in the same manner as in Example 1, except that the first electrodes were formed in a manner that the distance between the first electrodes of the adjacent photoelectric conversion elements was to be 10 micrometers, followed by forming the hole blocking layer. The results are presented in Table 2.

Comparative Example 2

Voc1, Pmax1, Voc2, Pmax2, and retention rates were obtained in the same manner as in Example 1, except that the first electrodes were formed in a manner that the distance between the first electrodes of the adjacent photoelectric conversion elements was to be 10 micrometer, followed by forming the hole blocking layer, and the distance between the electron transport layers and between the hole transport layers was changed to 10 micrometers. The results are presented in Table 2.

Comparative Example 3

Voc1, Pmax1, Voc2, Pmax2, and retention rates were obtained in the same manner as in Example 1, except that the distance between the electron transport layers and between the hole transport layer of the adjacent photoelectric conversion element was changed to 10 micrometers. The results are presented in Table 2.

Comparative Example 4

Voc1, Pmax1, Voc2, Pmax2, and retention rates were obtained in the same manner as in Example 2, except that the distance between the electron transport layers and between the hole transport layer of the adjacent photoelectric conversion element was changed to 10 micrometers. The results are presented in Table 2.

TABLE 2

| | 3,000 lux | | | | 100 lux | | | |
|---|---|---|---|---|---|---|---|---|
| | initial | | retention rate (%) | | initial | | retention rate (%) | |
| | Voc 1 (V) | Pmax 1 (μW/cm$^2$) | Voc 1 | Pmax 1 | VOC 2 (V) | Pmax 2 (μW/cm$^2$) | Voc 2 | Pmax 2 |
| Ex. 1 | 4.98 | 148.1 | 94.6 | 92.4 | 4.01 | 4.95 | 89.3 | 86.3 |
| Ex. 2 | 5.02 | 155.5 | 95.2 | 94.2 | 4.24 | 5.14 | 91.2 | 90.8 |
| Ex. 3 | 5.05 | 158.2 | 96.2 | 94.5 | 4.32 | 5.23 | 92.3 | 91.8 |
| Ex. 4 | 4.85 | 178.3 | 96.3 | 94.6 | 4.18 | 5.85 | 92.4 | 91.9 |
| Ex. 5 | 4.87 | 178.9 | 96.3 | 94.9 | 4.19 | 5.92 | 92.3 | 92.1 |
| Ex. 6 | 4.91 | 182.4 | 96.2 | 94.8 | 4.23 | 5.98 | 92.7 | 92.2 |
| Comp. Ex. 1 | 4.97 | 142.3 | 89.3 | 87.2 | 3.97 | 4.75 | 82.1 | 79.8 |
| Comp. Ex. 2 | 4.95 | 141.5 | 88.9 | 86.8 | 4.08 | 4.82 | 73.2 | 67.3 |
| Comp. Ex. 3 | 5.02 | 157.8 | 92.1 | 90.2 | 4.29 | 5.19 | 78.4 | 69.5 |
| Comp. Ex. 4 | 5.04 | 158.5 | 94.2 | 91.6 | 4.28 | 5.21 | 79.3 | 73.3 |

It was found from the results of Table 2 that Examples 1 to 6 could suppress a reduction in output with light of low illuminance before and after being exposed to light of high illuminance compared to Comparative Examples 1 to 4. Particularly, the effect as mentioned was significant with low illuminance light of 100 lux. Moreover, it was found that Examples 4 to 6, in which the cobalt complex compound was added to the hole transport material, had the higher retention rates than Examples 1 to 3.

As described above, in the solar cell module of the present disclosure, the hole blocking layers are not linked but the hole transport layers are linked within at least two adjacent photoelectric conversion elements. In other words, the solar cell module of the present disclosure includes a plurality of the photoelectric conversion elements, where within at least two of the photoelectric conversion elements adjacent to each other, the hole-blocking layers are not extended to each other but the hole transport layers are in a state of a continuous layer where the hole transport layers are extended to each other. As a result, the solar cell module of the present disclosure hardly occur leak electric current with light of high illuminance and the photosensitizing compound is hardly damaged. Therefore, a reduction in output with light of low illuminance can be prevented before and after being exposed to light of high illuminance. Accordingly, the solar cell module of the present disclosure can have high power output with light emitted from an illumination device used indoor, such as LED and a fluorescent lamp even after being exposed to sun light.

REFERENCE SIGNS LIST

1: first substrate
2, 2a, 2b: first electrode
3: hole blocking layer
4: electron transport layer
5: photosensitizing compound
6: hole transport layer
7, 7a, 7b: second electrode
8: sealing member
9: second substrate
10: through part (conduction part)
11: sealing member
101: photoelectric conversion element
102: solar cell module

The invention claimed is:

1. A solar cell module, comprising:
a plurality of photoelectric conversion elements,
wherein each photoelectric conversion element of the photoelectric conversion elements includes a first electrode, a hole blocking layer, an electron transport layer, a hole transport layer, and a second electrode,
wherein, for each photoelectric conversion element, the first electrode, the hole blocking layer, the electron transport layer, the hole transport layer, and the second electrode are formed in a same order on a shared first substrate, wherein a sealing member is disposed between the first substrate and a second substrate of the solar cell module,
wherein, within at least two of the photoelectric conversion elements adjacent to each other, the hole-blocking layers are not extended to each other, but the hole transport layers are in a continuous layer where the hole transport layers are extended to each other and the electron transport layers are in a continuous layer where the electron transport layers are extended to each other,
wherein for each photoelectric conversion element, a void part is formed between the second electrode and the second substrate so that the second electrode and the second substrate are not directly in contact with each other, and
wherein, for each photoelectric conversion element, the hole blocking layer is arranged on an entire surface of the first electrode opposite to the substrate.

2. The solar cell module according to claim 1,
wherein, within at least two of the photoelectric conversion elements adjacent to each other, the first electrode in one photoelectric conversion element and the second electrode in the other photoelectric conversion element are electrically connected via a conduction part piercing through the hole transport layers in the state of the continuous layer.

3. The solar cell module according to claim 1,
wherein the electron transport layer is a porous layer formed of titanium oxide particles, where a photosensitizing compound is adsorbed on surfaces of the titanium oxide particles.

4. The solar cell module according to claim 1,
wherein the hole transport layer includes a metal complex.

5. The solar cell module according to claim 4,
wherein the metal complex is a trivalent cobalt complex.

6. The solar cell module of claim 1, wherein a gap is formed between the hole-blocking layers of the at least two of the photoelectric conversion elements adjacent to each other, and the hole transport layers, as the continuous layer, extends into the gap.

7. The solar cell module according to claim 1, wherein the first electrode of one photoelectric conversion element and the second electrode of another adjacent photoelectric conversion element are electrically connected by a penetrating portion penetrating the first electrode, wherein the penetration portion comprises a second electrode.

8. The solar cell module according to claim 1, wherein, for each photoelectric conversion element, an oxygen concentration in the void part is in a range of 0.05 percent or greater and 10 percent or less.

* * * * *